(12) United States Patent
Parkhe

(10) Patent No.: US 10,685,861 B2
(45) Date of Patent: Jun. 16, 2020

(54) DIRECT OPTICAL HEATING OF SUBSTRATES THROUGH OPTICAL GUIDE

(71) Applicant: Applied Materials, Inc., Santa Clara, CA (US)

(72) Inventor: Vijay D. Parkhe, San Jose, CA (US)

(73) Assignee: APPLIED MATERIALS, INC., Santa Clara, CA (US)

(*) Notice: Subject to any disclaimer, the term of this patent is extended or adjusted under 35 U.S.C. 154(b) by 316 days.

(21) Appl. No.: 15/679,102

(22) Filed: Aug. 16, 2017

(65) Prior Publication Data

US 2018/0061683 A1   Mar. 1, 2018

Related U.S. Application Data

(60) Provisional application No. 62/380,298, filed on Aug. 26, 2016.

(51) Int. Cl.
| | |
|---|---|
| H05B 3/68 | (2006.01) |
| C23C 16/00 | (2006.01) |
| H01L 21/67 | (2006.01) |
| G02B 6/36 | (2006.01) |
| G02B 6/42 | (2006.01) |
| G02B 6/32 | (2006.01) |
| H05B 3/00 | (2006.01) |
| H01L 21/683 | (2006.01) |

(52) U.S. Cl.
CPC ......... *H01L 21/67115* (2013.01); *G02B 6/32* (2013.01); *G02B 6/3644* (2013.01); *G02B 6/4296* (2013.01); *H01L 21/67109* (2013.01); *H01L 21/6831* (2013.01); *H05B 3/0047* (2013.01); *G02B 6/3624* (2013.01)

(58) Field of Classification Search
CPC ...... G02B 6/32; G02B 6/3624; G02B 6/3644; G02B 6/4296; H01L 21/67109; H01L 21/67115; H01L 21/6831; H05B 3/0047
USPC .................... 219/443.1–468.2; 118/724–725
See application file for complete search history.

(56) References Cited

U.S. PATENT DOCUMENTS

| | | | | |
|---|---|---|---|---|
| 4,794,619 | A * | 12/1988 | Tregay | G01J 5/08 374/126 |
| 6,432,208 | B1 * | 8/2002 | Kawakami | C23C 16/4586 118/724 |
| 6,490,146 | B2 | 12/2002 | Wang et al. | |
| 6,538,872 | B1 | 3/2003 | Wang et al. | |
| 6,740,853 | B1 | 5/2004 | Johnson et al. | |
| 8,226,769 | B2 | 7/2012 | Matyushkin et al. | |
| 8,461,674 | B2 | 6/2013 | Gaff et al. | |
| 8,546,732 | B2 | 10/2013 | Singh | |
| 8,587,113 | B2 | 11/2013 | Gaff et al. | |
| 8,624,168 | B2 | 1/2014 | Gaff et al. | |
| 8,637,794 | B2 | 1/2014 | Singh et al. | |
| 8,663,391 | B2 | 3/2014 | Matyushkin et al. | |

(Continued)

*Primary Examiner* — Sang Y Paik
(74) *Attorney, Agent, or Firm* — Lowenstein Sandler LLP

(57) ABSTRACT

A substrate support assembly includes a ceramic plate, a cooling plate coupled to the ceramic plate, and an optical guide coupled to the cooling plate. The ceramic plate comprises a top surface, a bottom surface and a first channel, wherein the top surface is to support a substrate. The cooling plate comprises a second channel. The optical guide is to direct light onto the substrate. At least a portion of the optical guide is disposed in the first channel in the ceramic plate and the second channel in the cooling plate.

18 Claims, 6 Drawing Sheets

(56) References Cited

U.S. PATENT DOCUMENTS

| | | |
|---|---|---|
| 8,884,194 B2 | 11/2014 | Singh et al. |
| 8,937,800 B2 | 1/2015 | Lubomirsky et al. |
| 9,196,514 B2 | 11/2015 | Parkhe et al. |
| 9,224,583 B2 | 12/2015 | Povolny et al. |
| 2007/0258186 A1* | 11/2007 | Matyushkin ...... H01L 21/67109 361/234 |
| 2008/0017104 A1 | 1/2008 | Matyushkin et al. |
| 2013/0161305 A1 | 6/2013 | Ptasienski et al. |
| 2013/0220989 A1 | 8/2013 | Pease et al. |
| 2014/0045337 A1 | 2/2014 | Singh et al. |
| 2014/0047705 A1 | 2/2014 | Singh et al. |
| 2014/0048529 A1 | 2/2014 | Pease |
| 2014/0096909 A1 | 4/2014 | Singh et al. |
| 2014/0154819 A1 | 6/2014 | Gaff et al. |
| 2015/0070814 A1* | 3/2015 | Parkhe .............. H01L 21/67109 361/234 |
| 2015/0129165 A1 | 5/2015 | Parkhe et al. |
| 2015/0155193 A1 | 6/2015 | Hsu et al. |
| 2015/0170977 A1 | 6/2015 | Singh |
| 2015/0187625 A1 | 7/2015 | Busche et al. |
| 2015/0187626 A1 | 7/2015 | Parkhe et al. |
| 2015/0228513 A1 | 8/2015 | Parkhe et al. |
| 2015/0311105 A1 | 10/2015 | Sadjadi et al. |
| 2015/0357228 A1 | 12/2015 | Busche et al. |
| 2015/0364354 A1 | 12/2015 | Tantiwong et al. |
| 2015/0366004 A1 | 12/2015 | Nangoy et al. |
| 2016/0007411 A1 | 1/2016 | Busche et al. |
| 2016/0027678 A1 | 1/2016 | Parkhe et al. |
| 2017/0303338 A1 | 10/2017 | Parkhe |
| 2017/0316963 A1 | 11/2017 | Parkhe |
| 2018/0061684 A1 | 3/2018 | Parkhe |

\* cited by examiner

DIRECT OPTICAL HEATING OF SUBSTRATES THROUGH OPTICAL GUIDE

RELATED APPLICATIONS

This patent application claims the benefit under 35 U.S.C. § 119(e) of U.S. Provisional Application No. 62/380,298, filed Aug. 26, 2016, incorporated herein in its entirety.

TECHNICAL FIELD

Embodiments of the present invention relate to an apparatus for controlling substrate temperature using optical heating.

BACKGROUND

Conventional electronic device manufacturing systems may include one or more process chambers. During processing, a substrate (e.g., a wafer) may rest on a substrate support in a process chamber and the substrate may be heated. Conventionally, heating is provided by resistive heaters within the substrate support.

SUMMARY

In one aspect of the invention, a substrate support assembly includes a ceramic plate, a cooling plate coupled to the ceramic plate, and an optical guide coupled to the cooling plate. The ceramic plate comprises a top surface, a bottom surface and a first channel, wherein the top surface is to support a substrate. The cooling plate comprises a second channel. The optical guide is to direct light onto the substrate. At least a portion of the optical guide is disposed in the first channel in the ceramic plate and the second channel in the cooling plate.

In another aspect of the invention, an optical heating system for a chuck comprises a cooling base with a plurality of light sources disposed in the cooling base. The optical heating system further comprises an optical guide comprising a material that is substantially transparent to light output by the plurality of light sources. The optical guide comprises a plate portion that is coupled to the cooling base and a plurality of rods that protrude from the plate portion. A rod of the plurality of rods aligns with a light source of the plurality of light sources so as to direct the light from the light source through the rod and onto a substrate supported by the chuck.

In another aspect of the invention, a substrate support assembly comprises a ceramic plate, a cooling plate coupled to a bottom of the ceramic plate, an optical guide coupled to a bottom of the cooling plate, and a cooling base coupled to a bottom of the optical guide. A top surface of the ceramic plate is to support a substrate that is to be heated to a first target temperature and cooled to a second target temperature. The cooling plate is to be maintained at or below the second target temperature and is to cool the substrate to the second target temperature. The optical guide comprises a plurality of rods that extend through the cooling plate and into the ceramic plate. The cooling base comprises a plurality of light sources disposed in the cooling base to emit light into the optical guide to heat the substrate to the first target temperature.

Numerous other aspects of the invention are described herein. Other features and aspects of embodiments of the present invention will become more fully apparent from the following description, the appended claims, and the accompanying drawings.

BRIEF DESCRIPTION OF THE DRAWINGS

Implementations of the present invention are illustrated by way of example, and not by way of limitation, in the figures of the accompanying drawings in which like references indicate similar elements.

DETAILED DESCRIPTION OF EMBODIMENTS

Figure 1:
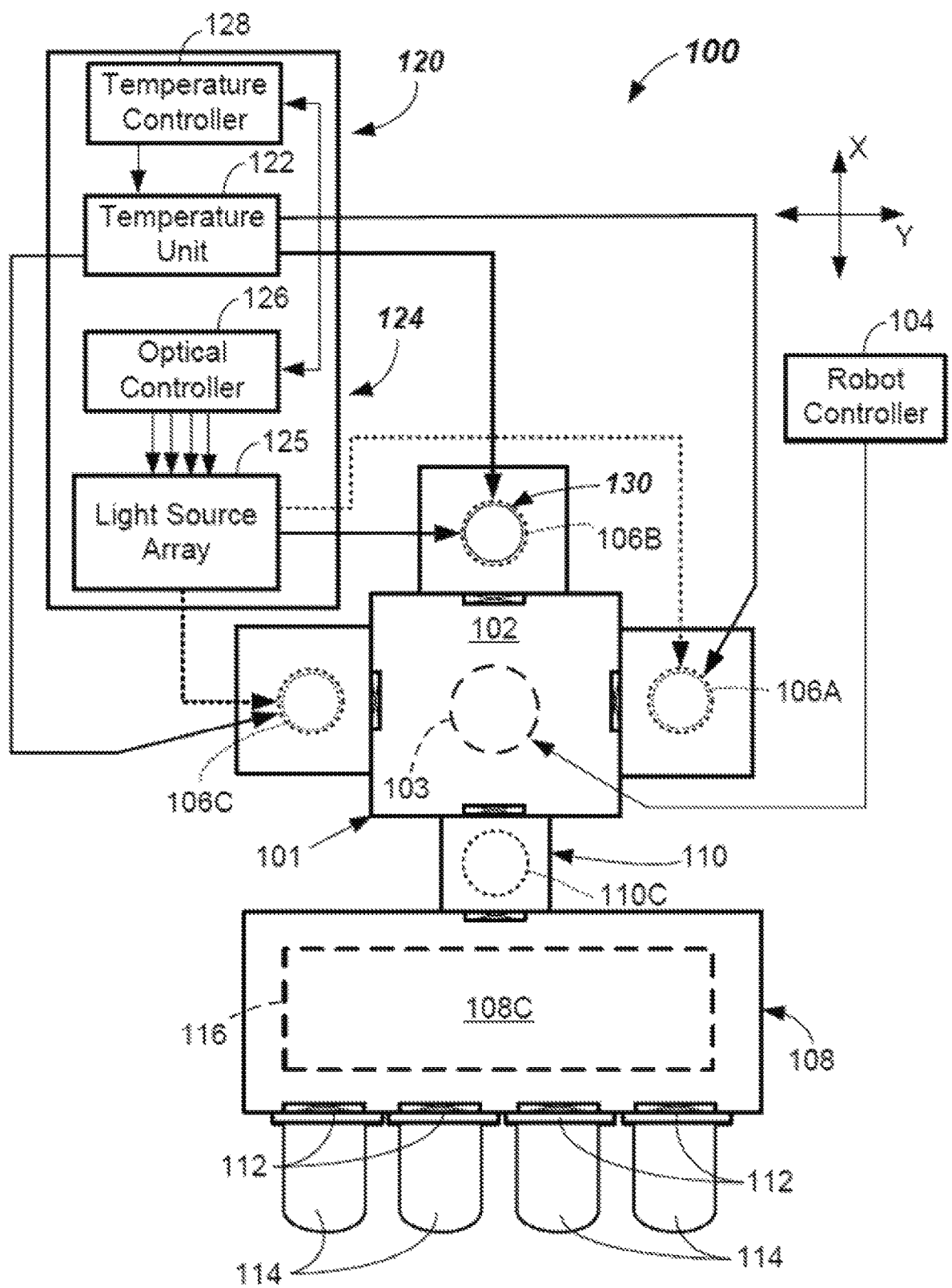
FIG. 1 illustrates a schematic top view of an electronic device processing system including optical heating in one or more process chambers according to implementations described herein.

Aspects of the present invention provide a substrate support assembly that includes an optical guide or other light transmission media that are used to directly heat substrates supported by the substrate support assembly. The substrate support assembly may include a ceramic plate coupled to a base. The ceramic plate has a top surface that is to support a substrate and a bottom surface that may be bonded to the base. The ceramic plate and the base each include multiple channels and light transmission media such as light pipes or optical fibers disposed in the channels. In one implementation, an optical guide includes a plate portion and a plurality of optically transparent rods that protrude from the plate portion. In some instances the plate portion is an optically transparent plate. The rods may each act as a light pipe. The plate and the rods may be formed from a single monolithic material such as sapphire, quartz or a carbon containing material such as an optically transparent carbon fiber such as polystyrene or acrylic. In some implementations, light transmission media other than the optical guide are used to transmit light. Light may be projected through the rods directly onto a bottom of a substrate that is supported by the ceramic plate.

Accordingly, the substrate may be heated up by the light emitted by the rods of the optical guide without heating the ceramic plate. Heating up the substrate directly may be much more efficient in terms of energy usage than heating up the ceramic plate. Additionally, by heating up the substrate directly without substantially affecting a temperature of the ceramic plate, the ceramic plate may be maintained at a target temperature that is different than a target temperature of the substrate.

The ability to heat up the substrate directly without heating up the ceramic plate of the substrate support assembly and the ability to cool the substrate introduces the possibility for new processes that implement heating and cooling on the same substrate support assembly that were previously unpractical. For example, in some implementations the substrate can be heated to higher temperatures than is recommended for the ceramic plate. Additionally, the substrate can be heated and cooled at a much higher rate than was previously achievable using systems that heated portions of the substrate support and indirectly heated the substrate based on contact between the substrate an the heated substrate support. Heating of the substrate can be performed in embodiments at rates of up to 20° C. per second (° C./s). The substrate can also be heated by light sources each having a power of about 1-20 Watts (W) in some implementations.

Cooling of the substrate can also be performed in embodiments at similar rates by maintaining the ceramic plate of the substrate support assembly at a lower temperature than the substrate is heated to. The substrate can be rapidly cooled in such situations by thermally coupling the heated substrate to the cooler ceramic plate of the substrate support assembly. The thermal coupling can be achieved by activating an electrode (e.g., a chucking electrode) and pumping a gas such as helium or argon into a region between the substrate and the ceramic plate.

Embodiments are described herein with reference to optical guides that include a plate portion and optically transparent rods (light pipes) that are used as a medium that delivers light to target areas. The plate portion may or may not be optically transparent. However, it should be understood that any type of light transmission media may be used to deliver the light to the target areas. The light transmission media may include, but are not limited to, optical fibers, sapphire rods, carbon containing rods (e.g., optically transparent carbon fiber rods, acrylic rods, polystyrene rods), quartz rods, an optical guide that includes sapphire and/or quartz rods, other types of light pipes, and so on. Other types of light transmission media that may be used include, for example, optical waveguides, light diffusers and/or lenses. Accordingly, it should be understood that embodiments described herein with reference to particular optical guides also apply to any other type of light transmission media.

FIG. 1 illustrates a schematic top view diagram of an example embodiment of an electronic device processing system 100 including an optical heating system according to one or more implementations of the present invention. The electronic device processing system 100 may include a housing 101 having walls defining a transfer chamber 102. Walls may include side walls, floor, and ceiling, for example. A robot 103 (shown as a dotted circle) may be at least partially housed within the transfer chamber 102. The robot 103 may place or extract substrates to and from various destinations via operation of moveable arms of the robot 103. "Substrates" as used herein shall mean articles used to make electronic devices or electrical circuit components, such as silicon-containing wafers or articles, patterned or masked silicon wafers or articles, or the like. However, the apparatus, systems, and methods described herein may have broad utility wherever temperature control of a substrate is useful. Implementations of the invention may be useful for rapid heating and cooling of substrates.

The motion of the various arms of the robot 103 may be controlled by suitable commands to a drive assembly (not shown) containing a plurality of drive motors from a robot controller 104. Signals from the robot controller 104 may cause motion of the various components of the robot 103 to cause movement of substrates between the process chambers 106A-106C and one or more load lock chambers 110C.

In the depicted embodiment, transfer chamber 102 may have one or more process chambers 106A-106C coupled to and accessible therefrom, at least some of which are adapted to carry out processing at elevated temperatures on the substrates inserted therein. The process chambers 106A-106C may be coupled to facets of the housing 101, and each process chamber 106A-106C may carry out a suitable process (e.g. a PECVD process or etch process) on the substrates. It should be understood that the substrate support assembly 130 described herein may have utility for other processes taking place at elevated temperature, such as physical vapor deposition, etch and ion implant, or the like. In particular, one or more of the processes taking place in the process chambers 106A-106C may include temperature control via direct optical heating of a substrate in accordance with aspects of the invention.

Within the electronic device processing system 100, substrates may be received from a factory interface 108, and also exit the transfer chamber 102 into the factory interface 108 through load lock chamber 110C of a load lock apparatus 110. The factory interface 108 may be any enclosure having wall surfaces forming the factory interface chamber 108C. One or more load ports 112 may be provided on some surfaces of the factory interface 108 and may be configured and adapted to receive (e.g., dock) one or more substrate carriers 114 (e.g., front opening unified pods—FOUPs) such as at a front surface thereof.

Factory interface 108 may include a suitable load/unload robot 116 (shown dotted) of conventional construction within a factory interface chamber 108C. The load/unload robot 116 may be configured and operational to extract substrates from the interior of the one or more substrate carriers 114 and feed the substrates into the one or more load lock chambers 110C of load lock apparatus 110.

In accordance with one or more implementations of the invention, a substrate support assembly 130 that includes a substrate support (e.g., an electrostatic chuck) may be provided in one or more of the process chambers 106A-106C. The substrate support may be a ceramic plate, which may be coupled to a cooling plate. The cooling plate may be a metal cooling plate or other thermally conductive cooling plate (e.g., a cooling plate formed from an AlSiSiC composite). The cooling plate and the ceramic plate may each include channels into which light transmission media such as optically transparent rods of an optical guide are inserted. As will be apparent from the following, a substrate support assembly 130 adapted to provide light-based heating of a substrate is provided. The description herein will focus on providing the substrate support assembly 130 in process chamber 106B. However, an identical or similar substrate support assembly 130 may be included in one or both of the other process chambers 106A, 106C. The substrate support assembly 130 may also be used in any other types of process chambers. In some embodiments, the substrate support assembly 130 may be included in all process chambers 106A-106C. More or less numbers of process chambers including the substrate support assembly 130 may be provided.

Figure 2:
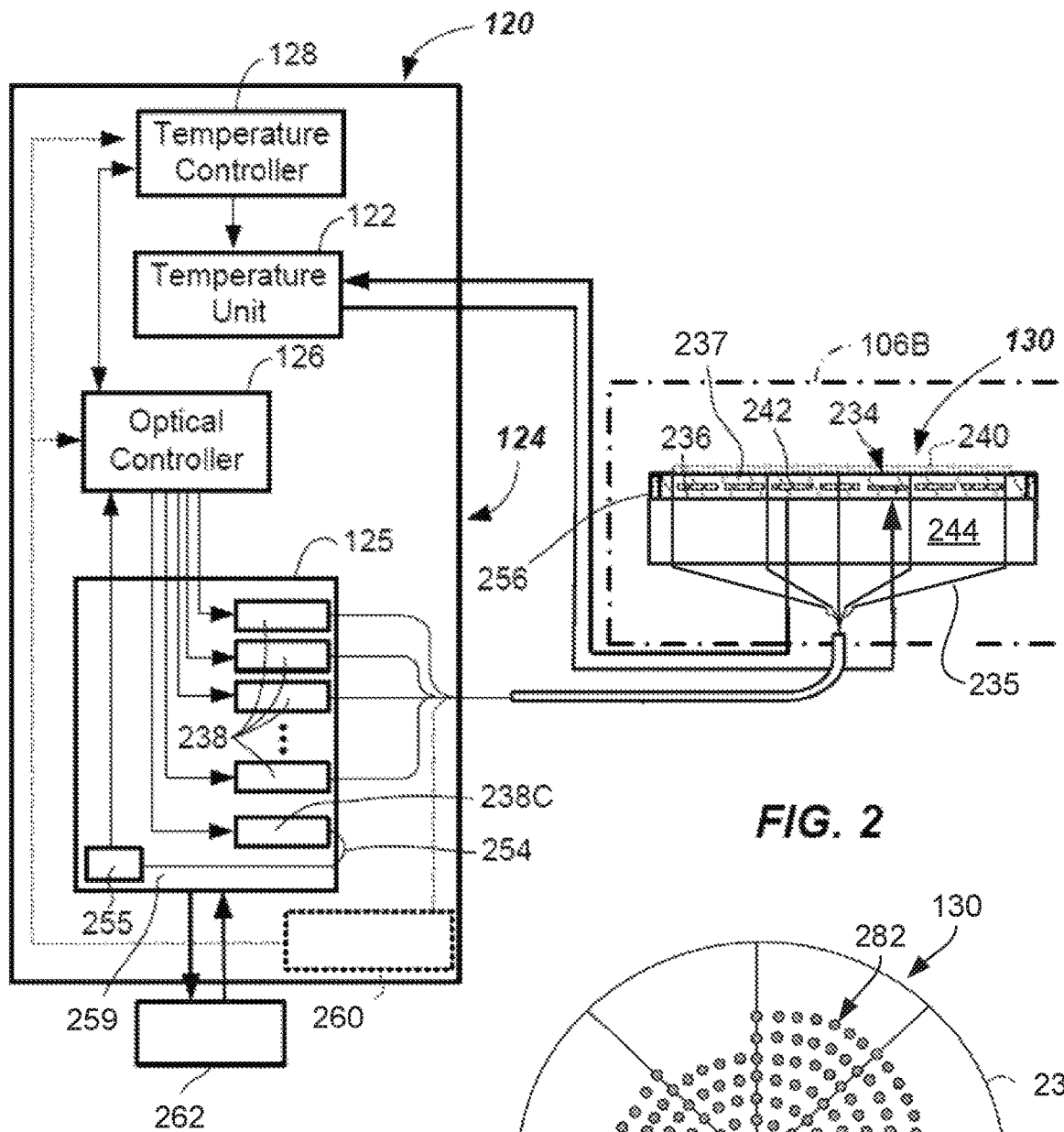
FIG. 2 illustrates a schematic partially cross-sectioned view of a substrate temperature control system for direct optical heating of a substrate, according to implementations described herein.
Figure 4:
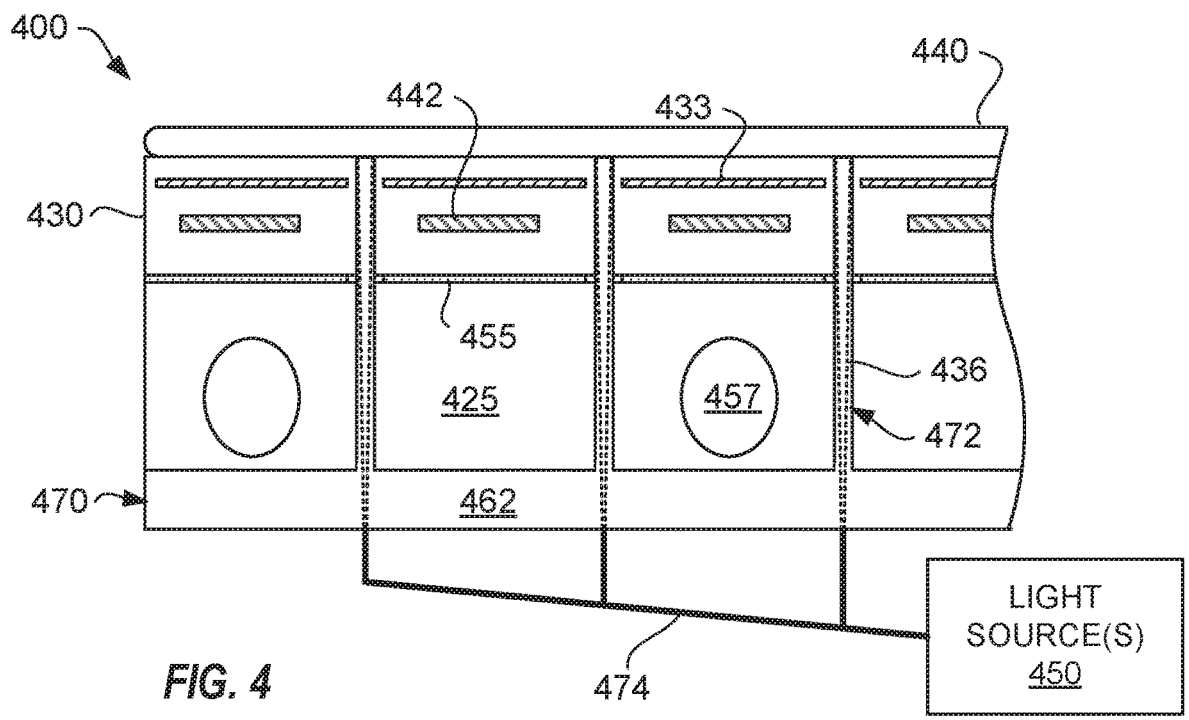
FIG. 4 illustrates a cross-sectional side view of a portion of a substrate support assembly with light-based heating using remote light sources, in accordance with implementations of the present invention.
Figure 5:
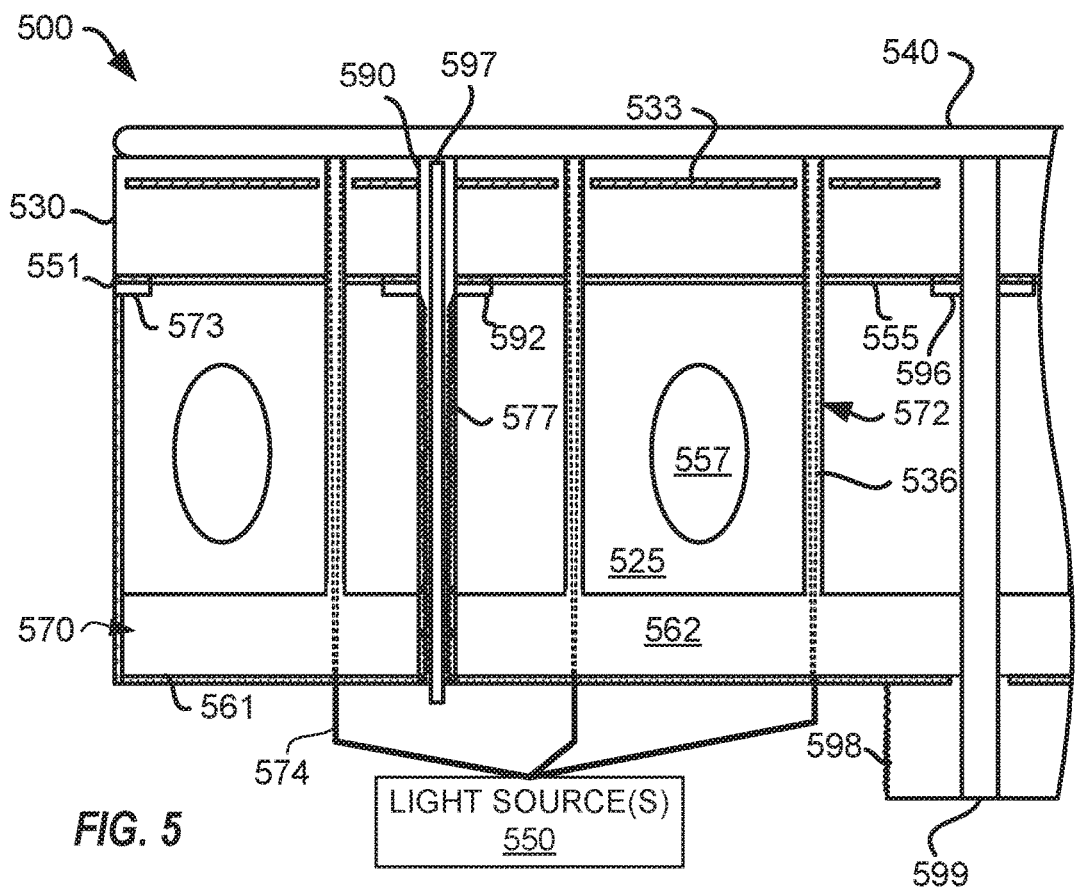
FIG. 5 illustrates a cross-sectional side view of a portion of another substrate support assembly with light-based heating capability using remote light sources, in accordance with implementations of the present invention.
Figure 6:
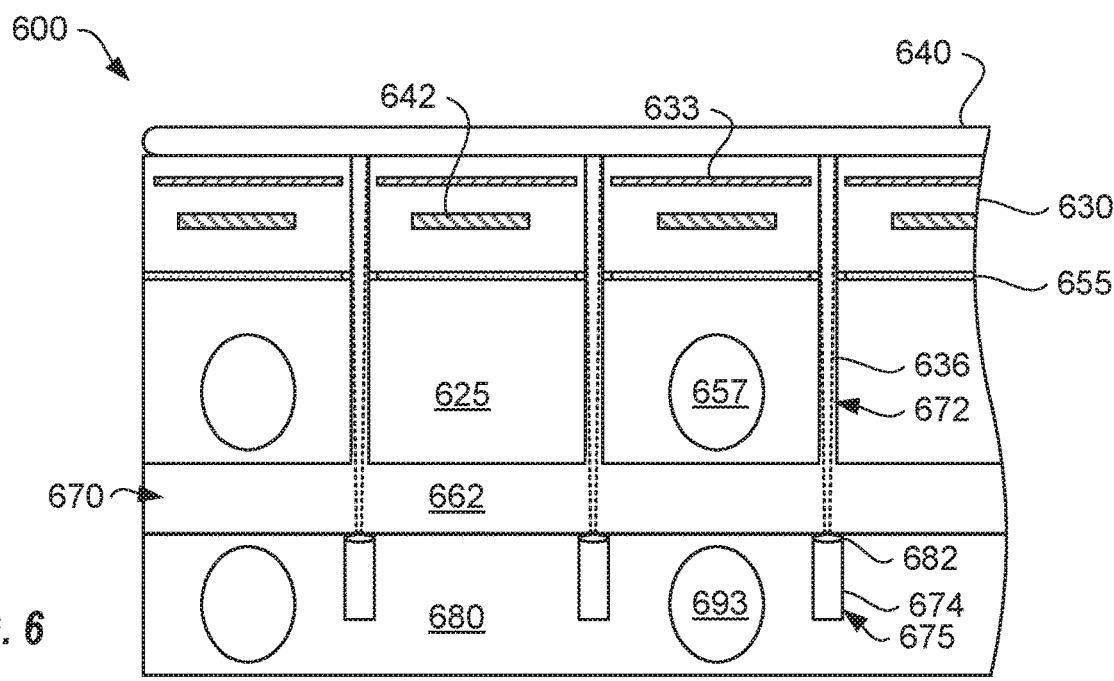
FIG. 6 illustrates a cross-sectional side view of a portion of a substrate support assembly with light-based heating capability using local light sources, in accordance with implementations of the present invention.
Figure 7:
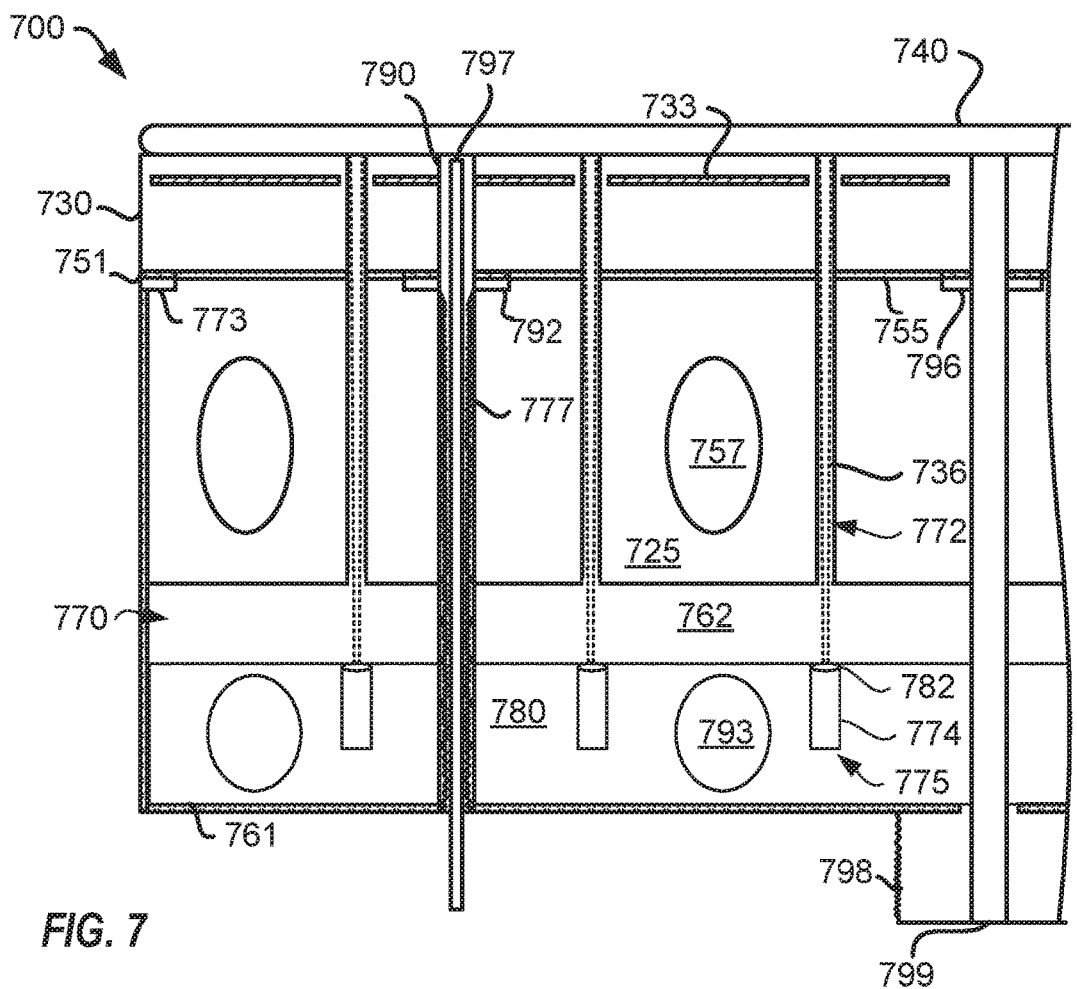
FIG. 7 illustrates a cross-sectional side view of a portion of another substrate support assembly with light-based heating capability using local light sources, in accordance with implementations of the present invention.

FIG. 2 illustrates a schematic partially cross-sectioned view of a substrate temperature control system 120 that performs optical heating. In the illustrated example, light sources 238 are remote from a substrate support assembly 130 and are external to process chamber 106B. The light sources may be coupled to optical fibers 235. The optical fibers 235 may be inserted into channels in the cooling plate 244 and ceramic plate 234 of substrate support assembly 130. Light from the light sources 238 may be directed through the optical fibers 235 and directed onto a bottom surface of a substrate 240. In other implementations, as shown in FIGS. 4-5, the optical fibers 235 may terminate at an optical guide 462, 562 that is coupled to a bottom of cooling plate 244. Light may travel through the optical fibers 235, then through the optical guide to heat the substrate 240. In other implementations, such as shown in FIGS. 6-7, the light sources 238 may be disposed in the substrate support assembly 130 and may be optically coupled directly to the optical guide without the use of optical fibers.

Referring now to FIGS. 1 and 2, in some implementations, a temperature unit 122 may be coupled to one or more resistive heating elements 242. The resistive heating elements 242 may be used in conjunction with optical heating provided by the substrate support assembly 130 to control a temperature of one or more portions of a substrate 240 to achieve a target temperature. The resistive heating elements 242 may provide a first level of temperature control of a substrate support (e.g., of a ceramic plate or electrostatic chuck) and/or supported substrate 240 and the optical fibers 235 may provide a second level of temperature control of the substrate 240.

In some implementations, the substrate support assembly 130 may not include resistive heating elements 242. Instead, optical fibers 235 and/or a light guide may provide a single level of temperature control of the substrate 240 via optical heating.

The optical fibers 235 and/or light guide may be made of sapphire, plastic, quartz, glass, carbon containing materials (e.g., an optically transparent carbon fiber such as acrylic or polystyrene) and/or other materials. Optical fibers 235 may include any suitable optical fiber type, such as graded-index optical fiber, step-index single mode optical fiber, multi-mode optical fiber, or even photonic crystal optical fiber. Optical fibers 235 that exhibit relatively high bend resistance may be used in some embodiments. Relatively high numerical aperture (NA) fibers may be used, such as NA of greater than about 0.1, greater than about 0.2, or even greater than about 0.3. Any suitable number of optical fibers 235 may be used, such as 20 or more, 50 or more, 100 or more, 200 or more 300 or more, 400 or more, and even up to 500 or more. Some of the optical fibers 235 may be fiber thermocouples. The optical fibers 235 may have coatings to improve performance in some embodiments. For example, at least a portion of the optical fibers 235 and/or optical guide may be coated with a plasma resistant ceramic coating such as $Y_2O_3$, $Y_3Al_5O_{12}$, and a ceramic compound comprising $Y_4Al_2O_9$ and a solid-solution of $Y_2O_3$—$ZrO_2$.

At a system level, temperature control may be provided by a substrate temperature control system 120. Substrate temperature control system 120 may be a subpart of the electronic device processing system 100. Substrate temperature control system 120 may include the temperature unit 122 that may couple and provide power to the resistive heating elements 242 (e.g., metal resistive heating elements or traces) and which may constitute a first source of temperature control (e.g., heating) to one or more of the chambers (e.g., process chambers 106A, 106B, 106C).

An optical heating system 124 may operate as a second heating system in conjunction with the temperature unit 122 and resistive heating elements 242 in some embodiments. Alternatively, substrate temperature control system 120 may not include temperature unit 122, and optical heating system 124 may be used to control the temperature of substrates. For example, the optical heating system 124 may be the only heating system adapted to heat the substrates 240 within the one or more process chambers 106A-106C.

Optical heating system 124 may include a light source array 125 or a single light source coupled (e.g., optically coupled) to the substrate support assembly 130, and an optical controller 126. The light source array 125 may include multiple light sources 238. Each light source 238 may be a laser diode, such as a single emitter diode, in some embodiments. Alternatively, each light source 238 may be a halogen lamp. The laser diode may have any suitable output wavelength range, such as between about 915 nm and about 980 nm, for example. Other wavelengths may also be used. Output power of the light sources 238 may be modulated between about 0 W to about 10 W in some examples. However, ever higher power light sources 238 (e.g., >10 W) may be used. Between about 1 and about 500 light sources 238 may be used in some implementations. As shown, the light sources 238 may be rest upon or be in thermal engagement with a common heat sink 259, which may be cooled (e.g., liquid cooled) to between about 20° C. and about 30° C. by a cooling source 262. Cooling source 262 may be a source of chilled water, for example. Other types of cooling sources 262 may be used. In implementations where the light sources 238 are included in the substrate support assembly 130, the common heat sink 259 may be integrated into the substrate support assembly as a cooling base.

Each light source 238 may be individually controlled and modulated from a low or zero level of optical power output to a high or maximum level of optical power output. Each light source 238 may be individually controlled in order to control temperature at finite points (pixels) or collectively controlled in groups of optical fibers and/or light pipes to control temperatures of one or more regions or zones of the substrate 240.

Any suitable temperature control philosophy may be implemented. In one control aspect, a highly uniform temperature distribution across an upper surface of the substrate 240 may be sought. In another aspect, a deliberately non-uniform temperature distribution may be implemented (e.g., hotter or cooler at an edge of the substrate 240). Each temperature profile may be provided in accordance with aspects of the invention depending on the control philosophy implemented by the optical controller 126.

Substrate temperature control system 120 may include a temperature controller 128 operational to control temperature of the substrate 240 that is being temperature controlled within the chamber (e.g., process chamber 106B). Temperature controller 128 may be operational to control the temperature unit 122 and may interface with the optical controller 126 in some embodiments. The temperature controller 128 may be used to communicate with the optical controller 126 and/or the temperature unit 122 to control a temperature of the substrate 240 supported by the substrate support assembly 130.

Figure 3:
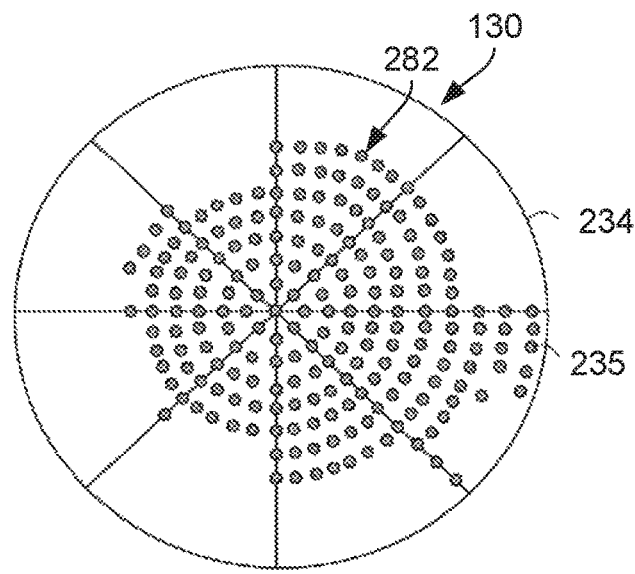
FIG. 3 illustrates a schematic top view of a portion of a substrate support assembly showing optical fibers disposed in the substrate support assembly according to implementations described herein.

FIG. 3 illustrates a schematic top view of a portion of a substrate support assembly 130. As shown, ceramic plate 234 includes multiple through channels 282, and light pipes or optical fibers 235 are inserted into those channels 282. The optical fibers 235 or light pipes are viewable from the top of the substrate support assembly 130. Alternatively, if an optical guide is used, as shown in FIGS. 4-7, then rods of the optical guide may be inserted into the channels 282, and may be visible in the top view.

FIG. 3 shows one possible pattern of a plurality of optical fibers 235 and/or rods of an optical guide. Any suitable arrangement may be made for inclusion of the plurality of optical fibers 235 and/or rods. In one such example, there may be between 10 to 500 channels 282 the ceramic plate 234 that include optical fibers 235 or rods. Although a very specific pattern is depicted in FIG. 3 for illustrative purposes, other different patterns (e.g., a symmetric pattern) may also be used. It is to be understood that FIG. 3 illustrates only one of many layout possibilities.

Now referring to FIGS. 2 and 3, the substrate support assembly 130, which is included in optical heating system 124, is described in more detail. Optical heating system 124 may include substrate support assembly 130. The substrate support assembly 130 includes ceramic plate 234. The ceramic plate 234 may be an electrostatic chuck that supports substrate 240, and may include an embedded chucking electrode. Substrate support assembly 130, as shown, includes ceramic plate 234 with embedded resistive heating elements. In some implementations, the ceramic plate 234 is an electrostatic chuck. In other implementations, the ceramic plate 234 is a vacuum chuck. The substrate support assembly 130 additionally includes a cooling plate 244 coupled to a bottom surface 236 of the ceramic plate 234. In one implementation, sidewalls of the ceramic plate 234 and/or cooling plate 244 are coated by a plasma resistant coating 256 such as yttria ($Y_2O_3$), YAG, or a ceramic compound comprising $Y_4Al_2O_9$ and a solid-solution of $Y_2O_3$—$ZrO_2$. A top surface of the ceramic plate 234 (including ends of rods or optical fibers 235) may also be coated by the plasma resistant coating 256.

The cooling plate 244 may be formed of a metal or other thermally conductive material such as aluminum, stainless steel, an AlSiSiC composite, and so on. The cooling plate 244 may include channels (not shown) that are filled with a cooling liquid. The ceramic plate 234 may be AN or $Al_2O_3$ in some implementations.

The cooling plate 244 and ceramic plate 234 may include multiple channels 282 into which optical fibers 235, optically transparent rods, or other light transmission media are inserted. The optical fibers 235, rods or other light transmission media may be oriented perpendicular to a bottom surface of the ceramic plate 234 as shown. Some or all of the optical fibers 235, rods or other light transmission media may also have other orientations in the base 244, such as at angles of between 45-90 degrees in relation to the bottom surface of the ceramic plate 234.

A top surface 237 of the ceramic plate 234 may have surface features such as mesas, rings, grooves, and so forth. The ceramic plate 234 may include gas channels for delivering backside gas such as helium to a region between the substrate 240 and the top surface 237. The ceramic plate 234 may also include gas channels for pumping air out of the region between the substrate 240 and the top surface 237 to form a vacuum in the region. Use of helium in the region may improve thermal contact between the substrate 240 and the ceramic plate 234. Use of a vacuum in the region may decrease the thermal contact (and improve thermal separation) between the ceramic plate 234 and the substrate 240.

The plurality of optical fibers 235 and/or rods are adapted to provide light-based heating of the substrate 240. The plurality of optical fibers 235 and/or rods may terminate at multiple locations in the ceramic plate 234. One example layout of the optical fibers 235 in the ceramic plate 234 is shown in FIG. 3. Optical heating system 124 may include the light source array 125 including a plurality of light sources 238 coupled to at least some, and preferably most or all, of the plurality of optical fibers 235 and/or optical guide. The optical controller 126 may be configured to control light power (e.g., intensity) channeled into, and carried by, the plurality of optical fibers 235 and/or optical guide.

In operation, light carried in at least some of the plurality of optical fibers 235 and/or optical guide is used to heat the substrate 240 without heating the ceramic plate 234 (or with minimal heating of the ceramic plate 234). When the plurality of optical fibers 235 and/or rods of the optical guide are positioned and terminated at different locations, many local portions of the substrate 240 (or all of the substrate) may be heated. In some implementations, this heating may be in conjunction with temperature control provided by the temperature unit 122 and the resistive heating elements 242. In other implementations, the heating by the plurality of optical fibers 235 and/or optical guide may be the only heating provided to the substrate 240.

For example, temperature control may, in some implementations, cause the substrate 240 (shown dotted) to be heated to a nominal temperature of greater than about 120° C., greater than 200° C., greater than about 500° C., greater than about 600° C., or even about 650° C. or a greater temperature. Such heating may be carried out on substrates 240 within the one or more process chambers 106A-106C in some implementations. For example, temperature control may, in some implementations, cause the substrate 240 (shown dotted) to be heated, such as in a PECVD process, an etch process, an atomic layer deposition (ALD) process, and so on.

One or more channels may be drilled into the cooling plate 244 and/or ceramic plate 234 to provide access for electrical lines to connect to the resistive heating elements 242 (also referred to as heating elements) and/or to one or more electrodes. The electrodes may include a chucking electrode that is used to secure a substrate to the substrate support assembly and/or a radio frequency (RF) electrode. The chucking electrode may use electrostatic forces to pull the substrate towards the ceramic plate.

In addition to optical fibers 235 that are used to provide heating, some optical fibers 235 may be used as fiber optic temperature sensors to measure a temperature of the substrate and/or a temperature of the ceramic plate. For example, some optical fibers 235 may be fiber optical thermocouples. Additionally or alternatively, temperature of the substrate and/or temperature of the ceramic plate may be measured by the optical fibers using infrared pyrometry. The fiber optical thermocouples and/or other fiber optical temperature sensors may be used to measure the temperature of the ceramic plate and/or substrate at various regions. Each optical fiber that is a component of a fiber optic temperature sensor may be used to measure a temperature at a region of the ceramic plate and/or substrate. Optical fibers that are to measure a temperature of the substrate in some embodiments are routed through a channel or gas passage in the ceramic plate and directed at the substrate. In some embodiments, optical fibers may be used both for heating and for temperature measurement. For example, an optical fiber may be split into two portions at one end. A first portion may be routed to an optical heat source such as a laser diode and a second portion may be routed to a temperature sensor.

In some embodiments, one or more of the light sources 238C may be coupled by a sensor fiber 254 to a control sensor 255, such as a light receiver (e.g., photodiode). A control sensor 255 may be used to provide feedback to the optical controller 126 on a relative output of a control light source 238C (e.g., of light intensity or heat generation, for example). Optionally or in addition, one or more optical temperature sensors may be provided in one or more channels in the cooling plate 244 and/or ceramic plate 234 and coupled to a temperature measuring system 260 to enable localized temperature monitoring of an inside portion of the substrate support assembly 130. For example, the optical temperature sensor may be a fiber Bragg grating coupled to a spectrometer, which may be the temperature measuring system 260. A fiber multiplexer or other like component may be used to connect multiple optical temperature sensors to a single spectrometer. An optical temperature sensor may also be accomplished by other suitable means, such as by embedding a tip of an optical fiber in a suitable adhesive material (e.g., CERAMACAST 865 available from Aremco Products Inc. of Valley Cottage, N.Y.) and measuring the thermal radiation emitted by that material. Thermal measurement may be accomplished by coupling the optical fiber to an indium gallium arsenide photodiode. The optical fibers or optically transparent rods coupled to the optical temperature sensor may also be placed in a channel in the cooling plate 244 and/or ceramic plate 234. Any suitable temperature measuring system 260 may be used to interrogate the optical temperature sensor. Temperature measuring system 260 may interface with the temperature controller 128 and/or the optical controller 126 to provide temperature feedback. Optionally or additionally, thermal feedback by other methods, such as two or more RTDs on the substrate support assembly 130 may be used.

FIG. 4 illustrates a cross-sectional side view of a portion of a substrate support assembly 400 with light-based heating capability, in accordance with implementations of the present invention. The substrate support assembly 400 includes a ceramic plate 430 coupled to a cooling plate 425, which is in turn coupled to an optical guide 462.

The ceramic plate 430 may be aluminum nitride (AlN) or aluminum oxide ($Al_2O_3$) in implementations. The ceramic plate 430 includes a top surface that supports a substrate 440 and a bottom surface that interfaces with the cooling plate 425. The ceramic plate 430 in one embodiment includes resistive heating elements 442 and an electrode layer 433. The resistive heating elements 442 may heat the ceramic plate to a target temperature. Alternatively, the ceramic plate 430 may not include any resistive heating elements 442.

The electrode layer 433 may be a radio frequency (RF) electrode that may be used for directing plasma. For example, an RF signal may be applied to the electrode layer 433 during processing of a supported substrate. The electrode layer 433 may alternatively or additionally be a chucking electrode that is used to electrostatically chuck or secure the substrate 440. The electrode layer 433 may be molybdenum, aluminum, or another material with high electrical conductivity. In some embodiments, the electrode layer 433 is a fine mesh of metal lines having a thickness and/or width of about 25-125 microns. The electrode layer 433 may be referred to as an electrode mesh. Accordingly, in embodiments the ceramic plate 430 is an electrostatic chuck. The ceramic plate 430 may be used for Johnsen-Rahbek and/or Coulombic electrostatic chucking in embodiments.

The cooling plate 425 is a metal plate that is responsible for cooling the ceramic plate 430 and optionally a supported substrate 440. The cooling plate 425 includes multiple channels 457 that receive a coolant. The cooling plate 425 may be, for example, aluminum or stainless steel. Other metals other thermally conductive materials such as AlSiSiC composite may also be used for the cooling plate 425. In some embodiments, an RF signal is applied to the cooling plate 425 during processing of a supported substrate.

The cooling plate 425 may be coupled to the ceramic plate 430 by a bond layer 455. The bond layer 455 may be a silicone bond, a metal bond, a glue, a braze, or another type of bond. The bond layer 455 may be a perforated bond layer. The cooling plate 425 may also be secured to the ceramic plate 430 by other coupling means in addition to or instead of bond layer 455. Examples of other coupling means include fasteners, springs that press the cooling plate 425 against the ceramic plate 430, and so on.

The cooling plate 425 and the ceramic plate 430 include multiple channels 436 to receive light carrying media such as optical fibers or rods of optical guide 462. Channels in the cooling plate 425 may align with channels in the ceramic plate 430. The light carrying media are inserted into the channels 436, and so are disposed inside of the cooling plate 425 and ceramic plate 430.

In one implementation, as shown in FIG. 4, optical guide 462 is bonded or otherwise coupled to a bottom of cooling plate 425. Optical guide 462 is composed of a material that is optically transparent (or at least substantially optically transparent) to light output by light sources 450. In one implementation, optical guide 462 is composed of sapphire, quartz or a carbon containing material such as an optically transparent carbon fiber. Optical guide 462 may include a plate portion 470 and multiple rods 472 that protrude from the plate portion 470. The rods 472 may align with channels 436 in the ceramic plate 430 and cooling plate 425. The rods 472 may be inserted into the channels 436, and the plate portion 470 of the optical guide 462 may be pressed against the bottom surface of the cooling plate 425.

In one implementation, the plate portion 470 of the optical guide 462 is bonded to the bottom surface of the cooling plate 425 by an additional bond layer (not shown). The additional bond layer may be a silicone bond, a metal bond, or another type of bond. Alternatively, or additionally, sides of the rods 472 may be bonded to walls of the channels 436 in the ceramic plate 430 and/or cooling plate 425 into which the rods 472 are inserted. In some implementations, an optical coating may be included on the bottom surface of the optical guide 462 to increase the efficiency of light transmittance. In some implementations, the rods or portions of the rods are coated with a plasma resistant ceramic coating. The plasma resistant ceramic coating may be a yttrium based coating such as yttria, YAG, or a ceramic compound comprising $Y_4Al_2O_9$ and a solid-solution of $Y_2O_3$—$ZrO_2$.

Optical fibers 474 may be coupled at one end to one or more light sources 450 and at another end to optical guide 462. The coupling may be a physical coupling or an optical coupling that may not include a physical connection. Each of the optical fibers 474 may be aligned with a rod 472 of the optical guide 462. Accordingly, light from an optical fiber 474 will be directed though a rod 472 of the optical guide 462.

The light sources 450 may be inside of a processing chamber that houses the substrate support assembly 400 or may be external to the processing chamber. The light sources may be, for example, laser diodes, light emitting diodes (LEDs), fiber lasers, halogen lamps, or conventional lights with a lens system. The light sources 450 may provide continuous or pulsed light. In an implementation, approximately 1000 watts (e.g., in the range of 200 W to 2000 W) is used for heating through the optical fibers 474 and optical guide 462. Implementations are able to achieve temperature uniformity over a substrate (e.g., over a 300 mm wafer) that has a temperature variance of less than 1 degree. Additionally, implementations are able to achieve rapid heating and cooling of substrate 440 in a single process.

FIG. 5 illustrates a cross-sectional side view of a portion of a substrate support assembly 500 with light-based heating capability, in accordance with implementations of the present invention. The substrate support assembly 500 may be used, for example, for metal deposition product (MDP) chambers, etch chambers, evaporation chambers, and other types of chambers. The substrate support assembly 500 includes a ceramic plate 530 coupled to a cooling plate 525 and an optical guide 562 coupled to the cooling plate 525. The ceramic plate 530, cooling plate 525 and/or optical guide 562 may be substantially similar to the ceramic plate 430, cooling plate 425 and/or optical guide 462, respectively, in some implementations. The ceramic plate 530 may be composed of any of the materials discussed with reference to ceramic plate 430. Similarly, the cooling plate 525 may be composed of any of the materials discussed with reference to cooling plate 425.

The ceramic plate 530 includes a top surface that supports a substrate 540 and a bottom surface that interfaces with the cooling plate 525. The ceramic plate 530 in one embodiment includes an electrode layer 533. The electrode layer 533 may be powered with a radio frequency (RF) power supply that may be used for directing plasma. The electrode layer 533 may additionally act as a chucking electrode that is used to electrostatically chuck or secure the substrate 540 by using high voltage DC power supply in implementations. The ceramic plate 530 and cooling plate 525 each have multiple channels 536 to allow a light carrying medium (e.g., rods of optical guide 562) to go through the cooling plate 525 and ceramic plate 530 and to optionally be flush with the top surface of the ceramic plate 530. In embodiments the ceramic plate 530 is an electrostatic chuck. The ceramic plate 530 may be used for Johnsen-Rahbek and/or Coulombic electrostatic chucking.

The cooling plate 525 includes multiple channels 557 that receive a coolant. The cooling plate 525 may be, for example, aluminum, an AlSiSiC composite or stainless steel. Other metals may also be used for the cooling plate 525.

The cooling plate 525 may be coupled to the ceramic plate 530 by a bond layer 555. The bond layer 555 may be a silicone bond, a metal bond, a glue, a braze, or another type of bond. The cooling plate 525 may also be secured to the ceramic plate 530 by other coupling means in addition to or instead of bond layer 555. Examples of other coupling means include fasteners, springs that press the cooling plate 525 against the ceramic plate 530, and so on. If the cooling plate 525 is not bonded to ceramic plate 530 (e.g., if the cooling plate is spring loaded and pressed against the ceramic plate using springs), then a graphoil layer may be used instead of the bond layer 555 at the junction between the cooling plate 525 and the ceramic plate 530 to improve a thermal conductivity at the junction. The bond layer 555 or graphoil layer may be a perforated bond layer that includes channels or gaps in the bond layer or graphoil layer at regions proximate to the channels 536.

The substrate support assembly 500 may additionally include an optical guide 562 that is coupled to the cooling plate 525. The optical guide 562 may include a plate portion 570 and multiple rods 572 that protrude from the plate portion 570. Each of the rods 572 may act as a light pipe to direct light onto a portion of substrate 540. The optical guide 562 may be formed from any of the materials described with reference to optical guide 462.

The rods 572 of optical guide 562 terminate at a first end near or at a top surface of the ceramic plate 530. A backside of the substrate support assembly 500 may be exposed to air and/or atmospheric pressure while a top of the substrate support assembly (e.g., between the top surface of the ceramic plate 530 and the substrate 540) may be maintained at a vacuum. In implementations, the optical guide 562 is attached to the ceramic plate 530 and/or to the cooling plate 525 in a manner that provides a seal.

In one implementation, the optical guide 562 is bonded to the cooling plate 525. For example, the plate portion 570 of the optical guide 562 may be bonded to a bottom surface of the cooling plate 525 by a silicone bond, metal bond, glue, braze, or other type of bond. Alternatively, or additionally, sides of the rods 572 may be bonded to walls of the channels 536 in the ceramic plate 530 and/or cooling plate 525 into which the rods 572 are inserted. The rods 572 of the optical guide 562 may be attached to the ceramic plate and/or cooling base along some or all of the length of the channels 536. The attachment may be a bond that fills in any voids between the rods 572 and the channels 536 and bonds the rods 572 to walls of the channels 536. The bond may be, for example, a braze or glue. The bond in some embodiments is at or near an end of the rods 572. The bond may or may not extend from the end further into the channels 536.

The substrate support assembly 500 further includes multiple rings 573, 592, 596 bonded to the bottom surface of the ceramic plate 530 by a bond 551. The bond 551 may be a silicone bond, a braze, or another bond. The rings include an outer ring 573 that is bonded to the ceramic plate 530 at an outer perimeter of the ceramic plate 530, an additional ring 592 bonded to the ceramic plate 530 around lift pin channels 590 and an additional ring 596 bonded to the ceramic plate 530 around a gas channel 599. The rings 573, 592, 596 may be a nickel-cobalt ferrous alloy (e.g., Kovar®), molybdenum, stainless steel or another material. The rings 573, 592, 596 may be bonded to the ceramic plate 530 by brazing. The rings 573, 592, 596 may also be bonded to the cooling plate 525 by welding such as e-beam welding.

The light sources 550 may be external to the substrate support assembly 500. Additionally, the light sources 550 may be internal to a processing chamber or external to the processing chamber. Optical fibers 574 may optically couple the light sources 550 to the optical guide 562. Optical fibers 574 may be aligned with rods 572 of the optical guide 562 to direct light through the rods 572.

In one embodiment, each optical fiber 574 (or other light carrying medium) is coupled to a different light source 550. Alternatively, a light source 550 may be coupled to multiple optical fibers 574. The light sources 550 may correspond to any of the light sources 450 discussed above.

A metal backside cover 561 may cover side walls and a bottom of the optical guide 562 as well as side walls of the cooling plate 525. The metal backside cover 561 may be welded (e.g., e-beam welded) to the ring 573 at the periphery of the cooling plate 525. A metal tube or metal bellows 598 may be welded to the metal backside cover 561, and may seal the gas channel 599 from exposure to the environment of the chamber. The metal tube or metal bellows 598 may be stainless steel or another metal.

Use of the metal backside cover 561, metal tube or metal bellows 577 and metal tube or metal bellows 598 enables the cooling plate to have a diameter that is similar to the diameter of the substrate 540.

The ceramic plate 530, cooling plate 525 and optical guide 562 may include lift pin channels 590. Lift pins 597 are disposed inside of the lift pin channels 590. A metal tube or metal bellows 577 may be inserted into the lift pin channels 590 and bonded to the metal backside cover 561 and to the rings 592. The metal tube or metal bellows 577 may permit the region inside of the bellows to be exposed to the environment of a processing chamber and protect a remainder of the substrate support assembly interior from exposure to the environment of the processing chamber.

As shown, rods 572 of the optical guide 562 are disposed inside ceramic plate 530 and directed toward substrate 540. The rods 572 emit light (shown as dashed lines) towards the substrate 540. The light is then absorbed by the substrate 540 and directly heats the substrate 540 as a result of the absorption. Accordingly, the light may heat the substrate 540 with little to no heating of the ceramic plate 530.

FIG. 6 illustrates a cross-sectional side view of a portion of a substrate support assembly 600 with light-based heating capability, in accordance with implementations of the present invention. The substrate support assembly 600 includes a ceramic plate 630 coupled to a cooling plate 625 and an optical guide 662 coupled to the cooling plate 625. The ceramic plate 630, cooling plate 625 and/or optical guide 662 may be substantially similar to the ceramic plate 430, cooling plate 425 and/or optical guide 462, respectively, in some implementations.

The ceramic plate 630 may be composed of any of the materials discussed with reference to ceramic plate 430. The ceramic plate 630 includes a top surface that supports a substrate 640 and a bottom surface that interfaces with the cooling plate 625. The ceramic plate 630 in one implementation includes resistive heating elements 642 and an electrode layer 633. The resistive heating elements 642 may heat the ceramic plate to a target temperature. Alternatively, the ceramic plate 630 may not include any resistive heating elements 642. The electrode layer 633 may be a radio frequency (RF) electrode that may be used for directing plasma. The electrode layer 633 may alternatively or additionally be a chucking electrode that is used to electrostatically chuck or secure the substrate 640. Accordingly, in embodiments the ceramic plate 630 is an electrostatic chuck. The ceramic plate 630 may be used for Johnsen-Rahbek and/or Coulombic electrostatic chucking in embodiments.

The cooling plate 625 includes multiple channels 657 that receive a coolant. The cooling plate 625 may be, for example, aluminum, an AlSiSiC composite or stainless steel. Other metals or other thermally conductive materials may also be used for the cooling plate 625.

The cooling plate 625 may be coupled to the ceramic plate 630 by a bond layer 655. The bond layer 655 may be a silicone bond, a metal bond, a glue, a braze, or another type of bond. The bond layer 655 may be a perforated bond layer. The cooling plate 625 may also be secured to the ceramic plate 630 by other coupling means in addition to or instead of bond layer 655. Examples of other coupling means include fasteners, springs that press the cooling plate 625 against the ceramic plate 630, and so on.

The substrate support assembly 600 additionally includes an optical guide 662 that is coupled to a bottom of cooling plate 625. Optical guide 662 includes a plate portion 670 and multiple rods 672 that protrude from the plate portion 670. The optical guide 662 may be composed of any of the materials described with reference to optical guide 462. In some implementations, an optical coating may be included on the bottom surface of the ceramic plate 630 to increase the efficiency of light transmittance. Additionally, or alternatively, rods 672 (or portions of rods 672) may be coated with a plasma resistant coating in some implementations.

The cooling plate 625 and ceramic plate 630 each include multiple channels 636 to receive light carrying media such as rods 672 of optical guide 662. The rods 672 of optical guide 662 may be inserted into the channels 636, and so are disposed inside of the cooling plate 625 and ceramic plate 630. Ends of the rods 672 may be flush with an upper surface of ceramic plate 630, or may be recessed from the upper surface of ceramic plate 630.

The substrate support assembly 600 additionally includes a cooling base 680 that is attached to a bottom of the optical guide 662. The cooling base 680 may be attached to the optical guide 662 by a bond (e.g., a silicone bond, metal bond, glue, braze, etc.). Alternatively, the cooling base 680 may be attached to the optical guide by other coupling means such as fasteners, springs, etc. that press the cooling base 680 against the optical guide 662.

The cooling base 680 may be a metal cooling base (e.g., aluminum or stainless steel) or other thermally conductive cooling base (e.g., a cooling base formed from an AlSiSiC composite). The cooling base 680 includes multiple channels 693 that are filled with a coolant. The cooling base 680 additionally includes multiple channels 675. Light sources 674 are disposed in the channels 675. Cooling base 680 may act as a heat sink for the light sources 674 and may cool the light sources.

A lens or reflector 682 may be disposed in each of the channels 675 near an output of light sources 674. The lens or reflector 682 may be positioned between the light source 674 an the optical guide 662, and may focus light emitted by the light sources 674 prior to the light entering optical guide 662. Each light source 674 may be aligned with a rod 672 of optical guide 662. Accordingly, light from a light source 674 may pass through the plate portion 670 of the optical guide 662 and then through a particular rod 672 of the optical guide 662 to illuminate a region of substrate 640.

FIG. 7 illustrates a cross-sectional side view of a portion of a substrate support assembly 700 with light-based heating capability, in accordance with implementations of the present invention. The substrate support assembly 700 may be used, for example, for metal deposition product (MDP) chambers, etch chambers, evaporation chambers, and other types of chambers. The substrate support assembly 700 includes a ceramic plate 730 coupled to a cooling plate 725 and an optical guide 762 coupled to the ceramic plate 730. The ceramic plate 730, cooling plate 725 and optical guide 762 may be substantially similar to ceramic plate 430, cooling plate 425 and optical guide 462, respectively in some implementations.

The ceramic plate 730 may be composed of any of the materials discussed with reference to ceramic plate 430. The ceramic plate 730 includes a top surface that supports a substrate 740 and a bottom surface that interfaces with the cooling plate 725. The ceramic plate 730 in one implementation includes an electrode layer 733. The electrode layer 733 may be a radio frequency (RF) electrode that may be used for directing plasma. The electrode layer 733 may alternatively or additionally be a chucking electrode that is used to electrostatically chuck or secure the substrate 740. Accordingly, in implementations the ceramic plate 730 is an electrostatic chuck. The ceramic plate 730 may be used for Johnsen-Rahbek and/or Coulombic electrostatic chucking in embodiments.

The cooling plate 725 includes multiple channels 757 that receive a coolant. The cooling plate 725 may be, for example, aluminum, an AlSiSiC composite or stainless steel. Other metals may also be used for the cooling plate 725.

The cooling plate 725 may be coupled to the ceramic plate 730 by a bond layer 755. The bond layer 755 may be a silicone bond, a metal bond, a glue, a braze, or another type of bond. The cooling plate 725 may also be secured to the ceramic plate 730 by other coupling means in addition to or instead of bond layer 755. In one embodiment, bond 755 and bond 751 are parts of a single bond layer. Examples of other coupling means include fasteners, springs that press the cooling plate 725 against the ceramic plate 730, and so on. If the cooling plate 725 is not bonded to ceramic plate 730, then a graphoil layer may be used instead of the bond layer 755 at the junction between the cooling plate 725 and the ceramic plate 730 to improve a thermal conductivity at the junction.

The substrate support assembly 700 may additionally include an optical guide 762 that is coupled to the cooling plate 725. The optical guide 762 may include a plate portion 770 and multiple rods 772 that protrude from the plate portion 770. Each of the rods 772 may act as a light pipe to direct light onto a portion of substrate 740. The optical guide 762 may be formed from any of the materials described with reference to optical guide 462.

The rods 772 of optical guide 762 terminate at a first end near or at a top surface of the ceramic plate 730. A backside of the substrate support assembly 700 may be exposed to air and/or atmospheric pressure while a top of the substrate support assembly (e.g., between the top surface of the ceramic plate 730 and the substrate 740) may be maintained at a vacuum. In implementations, the optical guide 762 is attached to the ceramic plate 730 and/or to the cooling plate 725 in a manner that provides a seal.

In one implementation, the optical guide 762 is bonded to the cooling plate 725. For example, the plate portion 770 of the optical guide 762 may be bonded to a bottom surface of the cooling plate 725 by a silicone bond, metal bond, glue, braze, or other type of bond. Alternatively, or additionally, sides of the rods 772 may be bonded to walls of the channels 736 in the ceramic plate 730 and/or cooling plate 725 into which the rods 772 are inserted. The rods 772 of the optical guide 762 may be attached to the ceramic plate and/or cooling base along some or all of the length of the channels 736. The attachment may be a bond that fills in any voids between the rods 772 and the channels 736 and bonds the rods 772 to walls of the channels 736. The bond may be, for example, a braze or glue. The bond in some embodiments is at or near an end of the rods 772. The bond may or may not extend from the end further into the channels 736.

The substrate support assembly 700 additionally includes a cooling base 780 that is attached to a bottom of the optical guide 762. The cooling base 780 may be attached to the optical guide 762 by a bond (e.g., a silicone bond, metal bond, glue, braze, etc.). Alternatively, the cooling base 780 may be attached to the optical guide by other coupling means such as fasteners, springs, etc. that press the cooling base 780 against the optical guide 762.

The cooling base 780 may be a metal cooling base (e.g., aluminum or stainless steel) or other thermally conductive cooling base (e.g., a cooling base formed from an AlSiSiC composite). The cooling base 780 includes multiple channels 793 that are filled with a coolant. The cooling base 780 additionally includes multiple channels 775. Light sources 774 are disposed in the channels 775. Cooling base 780 may act as a heat sink for the light sources 774 and may cool the light sources.

A lens or reflector 782 may be disposed in each of the channels 775 near an output of light sources 774. The lens or reflector 782 may be positioned between the light source 774 and the optical guide 762, and may focus light emitted by the light source 774 prior to the light entering optical guide 762. Each light source 774 may be aligned with a rod 772 of optical guide 762. Accordingly, light from a light source 774 may pass through the plate portion 770 of the optical guide 762 and then through a particular rod 772 of the optical guide 762 to illuminate a region of substrate 740.

The substrate support assembly 700 further includes multiple rings 773, 792, 796 bonded to the bottom surface of the ceramic plate 730 by a bond 751. The bond 751 may be a silicone bond, a braze, or another bond. The rings include an outer ring 773 that is bonded to the ceramic plate 730 at an outer perimeter of the ceramic plate 730, an additional ring 792 bonded to the ceramic plate 730 around lift pin channels 790 and an additional ring 796 bonded to the ceramic plate 730 around a gas channel 799. The rings 773, 792, 796 may be a nickel-cobalt ferrous alloy (e.g., Kovar®), molybdenum, or another material. The rings 773, 792, 796 may be bonded to the ceramic plate 730 by brazing. The rings 773, 792, 796 may also be bonded to the cooling plate 725 by welding such as e-beam welding.

A metal backside cover 761 may cover side walls and a bottom of the cooling plate 725. The metal backside cover 761 may be welded (e.g., e-beam welded) to the ring 773 at the periphery of the cooling plate 725. A metal tube or metal bellows 798 may be welded to the metal backside cover 761, and may seal the gas channel 799 from exposure to the environment of the chamber. The metal tube or metal bellows 798 may be stainless steel or another metal.

Use of the metal backside cover 761, metal tube or metal bellows 777 and metal tube or metal bellows 798 enables the cooling plate to have a diameter that is similar to the diameter of the substrate 740.

The ceramic plate 730, cooling plate 725 and optical guide 762 may include lift pin channels 790. Lift pins 797 are disposed inside of the lift pin channels 790. A metal tube or metal bellows 777 may be inserted into the lift pin channels 790 and bonded to the metal backside cover 761 and to the rings 792. The metal tube or metal bellows 777 may permit the region inside of the bellows to be exposed to the environment of a processing chamber and protect a remainder of the substrate support assembly interior from exposure to the environment of the processing chamber.

Figure 8:
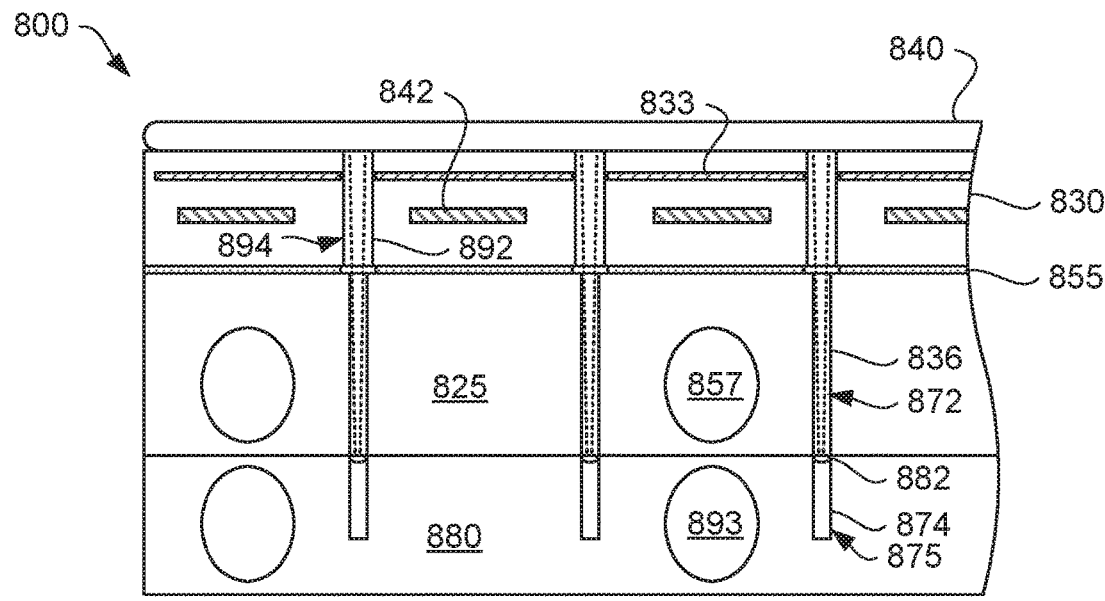
FIG. 8 illustrates a cross-sectional side view of a portion of a substrate support assembly with light-based heating capability, in accordance with implementations of the present invention.

FIG. 8 illustrates a cross-sectional side view of a portion of a substrate support assembly 800 with light-based heating capability, in accordance with implementations of the present invention. The substrate support assembly 800 includes a ceramic plate 830 coupled to a cooling plate 825 and a cooling base 880 coupled to the cooling plate 825.

The ceramic plate 830, may be substantially similar to ceramic plate 430 in some implementations. The ceramic plate 830 may be composed of any of the materials discussed with reference to ceramic plate 430. The ceramic plate 830 includes a top surface that supports a substrate 840 and a bottom surface that interfaces with the cooling plate 825. The ceramic plate 830 in one implementation includes resistive heating elements 842 and an electrode layer 833. The resistive heating elements 842 may heat the ceramic plate to a target temperature. Alternatively, the ceramic plate 830 may not include any resistive heating elements 842. The electrode layer 833 may be a radio frequency (RF) electrode that may be used for directing plasma. Alternatively, an RF signal may be applied to the cooling plate 825. If the RF signal is applied to the cooling plate 825, then an insulating plate such as rexolite is used to separate the cooling plate 825 from the cooling base 880 (and from ground).

The electrode layer 833 may alternatively or additionally be a chucking electrode that is used to electrostatically chuck or secure the substrate 840. Accordingly, in some implementations the ceramic plate 830 is an electrostatic chuck. The ceramic plate 830 may be used for Johnsen-Rahbek and/or Coulombic electrostatic chucking in embodiments.

The cooling plate 825 includes multiple channels 857 that receive a coolant. The cooling plate 825 may be, for example, aluminum, an AlSiSiC composite or stainless steel. Other metals or other thermally conductive materials may also be used for the cooling plate 825.

The cooling plate 825 may be coupled to the ceramic plate 830 by a bond layer 855. The bond layer 855 may be a silicone bond, a metal bond, a glue, a braze, or another type of bond. The bond layer 855 may be a perforated bond layer. The cooling plate 825 may also be secured to the ceramic plate 830 by other coupling means in addition to or instead of bond layer 855. Examples of other coupling means include fasteners, springs that press the cooling plate 825 against the ceramic plate 830, and so on.

The cooling plate 825 includes multiple through channels 836. The ceramic plate 830 additionally includes multiple through channels 892 that align with the channels 836 in the cooling plate 825. The channels 892 and channels 836 may be the same diameter or may be different diameters. In some implementations, the channels 892 and channels 836 are the same diameter, and light transmission media such as optical fibers or optically transparent rods 894 are inserted into the channels 892 and channels 836. Accordingly, part of a rod or optical fiber may be disposed in the cooling plate 825 and another part of the rod or optical fiber may be disposed in the ceramic plate 830. In some implementations, the channels 892 have a larger diameter than the channels 836. In such implementations, first light transmission media 894 may be disposed in channels 892, and separate second light transmission media 872 may be disposed in channels 836. Alternatively, light transmission media may have a step at which the light transmission media change diameter. Such light transmission media may be partly in the cooling plate 825 and partly in the ceramic plate 830. In other implementations, no rods or optical fibers may be inserted in the channels 836. In some implementations, the light transmission media 894 are light diffusers. The light diffusers may increase a beam size of light that passes through the light diffusers. For example, channels 836 may have a diameter of 4-6 mm, and channels 892 may have a diameter of about 7-10 mm. The light diffusers may receive light that has a beam size of about 4-6 mm and may diffuse the light to a beam size of about 7-10 mm. In other implementations, the light transmission media 894 may be lenses that reduce a beam size of the light.

The substrate support assembly 800 additionally includes cooling base 880 attached to a bottom of the cooling plate 825. The cooling base 880 may be attached to the cooling plate 825 by a bond (e.g., a silicone bond, metal bond, glue, braze, etc.). Alternatively, the cooling base 880 may be attached to the cooling plate 825 by other coupling means such as fasteners, springs, etc. that press the cooling base 880 against the cooling plate 825.

The cooling base 880 may be a metal cooling base (e.g., aluminum or stainless steel) or other thermally conductive cooling base (e.g., a cooling base formed from an AlSiSiC composite). The cooling base 880 includes multiple channels 893 that are filled with a coolant. The cooling base 880 additionally includes multiple channels 875. Light sources 874 are disposed in the channels 875. Cooling base 880 may act as a heat sink for the light sources 874 and may cool the light sources.

A lens or reflector 882 may be disposed in each of the channels 875 near an output of light sources 874. The lens or reflector 882 may focus light emitted by the light sources 874. Each light source 874 may be aligned with a light transmission media 894. Accordingly, light from a light source 874 may pass through the light transmission media 894 to illuminate a region of substrate 840.

Figure 9:
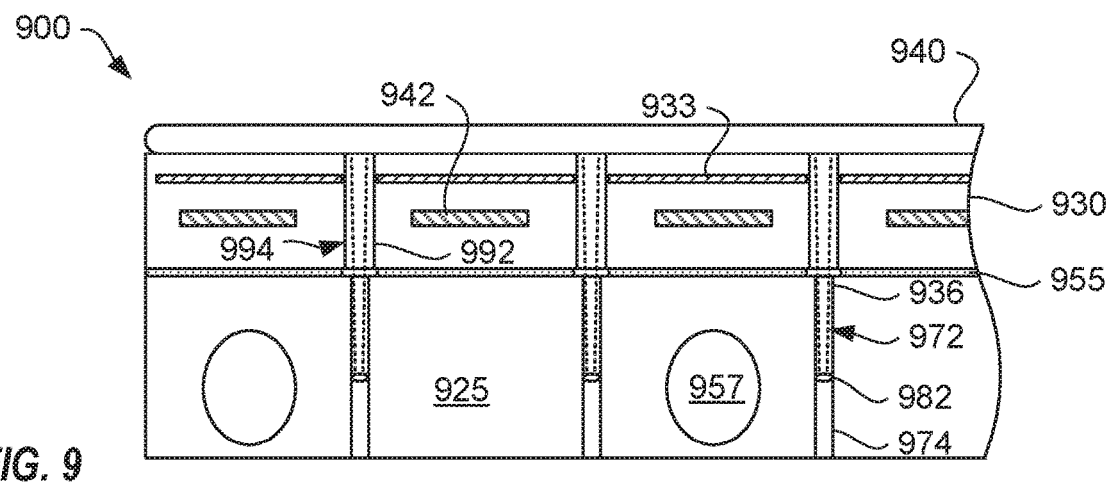
FIG. 9 illustrates a cross-sectional side view of a portion of a substrate support assembly with light-based heating capability, in accordance with implementations of the present invention.

FIG. 9 illustrates a cross-sectional side view of a portion of a substrate support assembly 900 with light-based heating capability, in accordance with implementations of the present invention. The substrate support assembly 900 includes a ceramic plate 930 coupled to a cooling plate 925.

The ceramic plate 930, may be substantially similar to ceramic plate 830 in some implementations. The ceramic plate 930 may be composed of any of the materials discussed with reference to ceramic plate 430. The ceramic plate 930 includes a top surface that supports a substrate 940 and a bottom surface that interfaces with the cooling plate 925. The ceramic plate 930 in one implementation includes resistive heating elements 942 and an electrode layer 933. The resistive heating elements 942 may heat the ceramic plate to a target temperature. Alternatively, the ceramic plate 930 may not include any resistive heating elements 942. The electrode layer 933 may be a radio frequency (RF) electrode that may be used for directing plasma. Alternatively, an RF signal may be applied to the cooling plate 925. If the RF signal is applied to the cooling plate 925, then an insulating plate such as rexolite is used to separate the cooling plate 925 from ground. The electrode layer 933 may alternatively or additionally be a chucking electrode that is used to electrostatically chuck or secure the substrate 940. Accordingly, in some implementations the ceramic plate 930 is an electrostatic chuck. The ceramic plate 930 may be used for Johnsen-Rahbek and/or Coulombic electrostatic chucking in embodiments.

The cooling plate 925 includes multiple channels 957 that receive a coolant. The cooling plate 925 may be, for example, aluminum, an AlSiSiC composite or stainless steel. Other metals or other thermally conductive materials may also be used for the cooling plate 925.

The cooling plate 925 may be coupled to the ceramic plate 930 by a bond layer 955. The bond layer 955 may be a silicone bond, a metal bond, a glue, a braze, or another type of bond. The bond layer 955 may be a perforated bond layer. The cooling plate 925 may also be secured to the ceramic plate 930 by other coupling means in addition to or instead of bond layer 955. Examples of other coupling means include fasteners, springs that press the cooling plate 925 against the ceramic plate 930, and so on.

The cooling plate 925 includes multiple channels 936. Light sources 974 are disposed in the channels 936. Cooling plate 925 may act as a heat sink for the light sources 974 and may cool the light sources. A lens or reflector 982 may be disposed in each of the channels 936 near an output of light sources 974. The lens or reflector 982 may focus light emitted by the light sources 974.

The ceramic plate 930 additionally includes multiple through channels 992 that align with the channels 936 in the cooling plate 925. The channels 992 and channels 936 may be the same diameter or may be different diameters. In some implementations, the channels 992 and channels 936 are the same diameter, and light transmission media such as optical fibers or optically transparent rods 994 are inserted into the channels 992 and channels 936. Accordingly, part of a rod or optical fiber may be disposed in the cooling plate 925 and another part of the rod or optical fiber may be disposed in the ceramic plate 930. In some implementations, the channels 992 have a larger diameter than the channels 936. In such implementations, first light transmission media 994 may be disposed in channels 992, and separate second light transmission media 972 may be disposed in channels 936. Alternatively, light transmission media may have a step at which the light transmission media change diameter. Such light transmission media may be partly in the cooling plate 925 and partly in the ceramic plate 930. In other implementations, no rods or optical fibers may be inserted in the channels 936. In some implementations, the light transmission media 994 are light diffusers. The light diffusers may increase a beam size of light that passes through the light diffusers. For example, channels 936 may have a diameter of 4-6 mm, and channels 992 may have a diameter of about 7-10 mm. The light diffusers may receive light that has a beam size of about 4-6 mm and may diffuse the light to a beam size of about 7-10 mm. In other implementations, the light transmission media 994 may be lenses that reduce a beam size of the light.

In some implementations, substrate support assemblies 400, 500, 600, 700, 800 and 900 are used for processes where the substrate 440, 540, 640, 740, 840, 940 is repeatedly heated to a first target temperature and cooled to a second lower target temperature during processing. In embodiments, the first target temperature is around 120-400° C. In further embodiments, the first target temperature is around 120-150° C. The substrate support assemblies 400, 500, 600, 700, 800, 900 may facilitate such processes by using the cooling plate 425, 525, 625, 725, 825, 925 to maintain the ceramic plate 430, 530, 630, 730, 830, 930 at or below the second target temperature. The resistive heating elements may not be included in the ceramic plate 430, 530, 630, 730, 830, 930 and/or may not be used in these embodiments. The rods 472, 572, 672, 772 of the optical guide 462, 562, 662, 762 or the light transmission media 892, 992 may emit light with a power of about 1-20 Watts that heats the substrate 440, 540, 640, 740, 840, 940 at a rapid heating rate of up to about 20° C./s. The optical heating may be performed while the electrode 433, 533, 633, 733, 833, 933 is deactivated so as to minimize thermal contact between the substrate 440, 540, 640, 740, 840, 940 and the ceramic plate 430, 530, 630, 730, 830, 930.

After the substrate 440, 540, 640, 740, 840, 940 has been heated to the first target temperature, the electrode 433, 533, 633, 733, 833, 933 may be activated. Additionally, helium or another thermally conductive gas may be pumped into a region between the substrate 440, 540, 640, 740, 840, 940 and the upper surface of the ceramic plate 430, 530, 630, 730, 830, 930 through a gas passage. The electrode 433, 533, 633, 733, 833, 933 may chuck the substrate 440, 540, 640, 740, 840, 940, pulling the substrate tightly against the ceramic plate. A combination of the chucking and the helium may thermally couple the substrate to the ceramic plate. The ceramic plate 430, 530, 630, 730, 830, 930, which is at or below the second target temperature, then rapidly cools off the substrate 440, 540, 640, 740 at a rate of up to about 20° C./s.

Once the substrate 440, 540, 640, 740, 840, 940 has reached the second target temperature, the electrode 433, 533, 633, 733, 833, 933 may be deactivated and/or the helium may be pumped out of the region between the ceramic plate and the substrate to again thermally decouple the substrate from the ceramic plate. This process may be repeated numerous times in a single process.

For some implementations associated with FIGS. 6-7, components of the substrate support assembly may have the following dimensions. The ceramic plate may have a thickness of about 5-10 mm (e.g., around 5 mm). The cooling plate may have a thickness of about 10-20 mm (e.g., around 15 mm). The plate portion of the optical guide may have a thickness of about 5-10 mm. The rods of the optical guide may have a thickness of about 15-30 mm. In some implementations, the rods have a length that is about 0.2-1.0 mm less than a combined thickness of the ceramic plate and cooling plate. The cooling base may have a thickness of about 10-30 mm.

Figure 10:
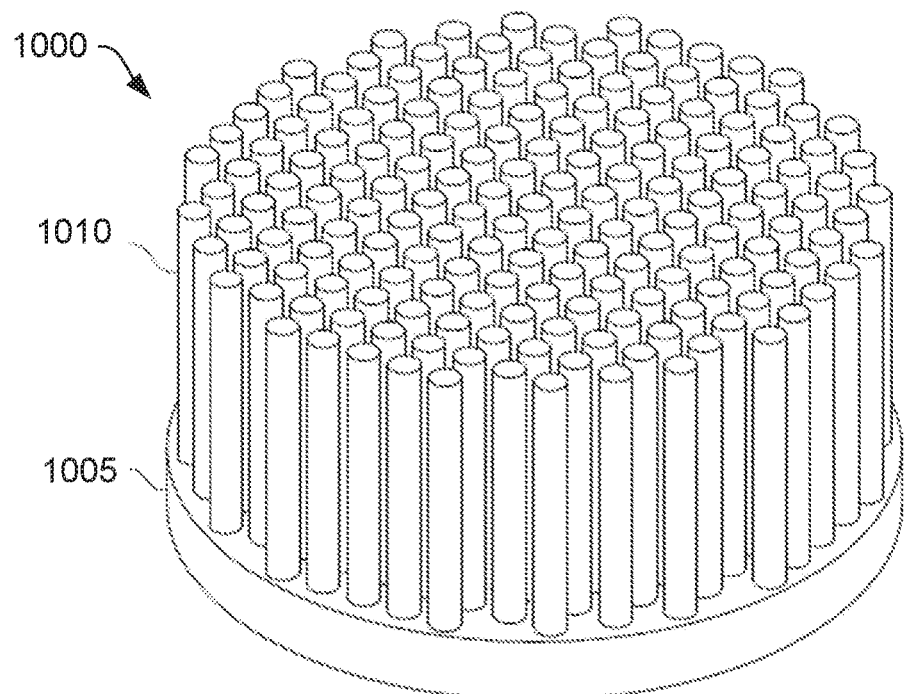
FIG. 10 illustrates a perspective view of an optical guide that may be used for an optical heating system of a substrate support assembly, in accordance with implementations of the present invention.

FIG. 10 illustrates a perspective view of an optical guide 1000. The optical guide may correspond to any of optical guides 462, 562, 662 and/or 762 and may be used in any of substrate support assemblies 400, 500, 600, 700. The optical guide 1000 includes a plate portion 1005 and multiple rods 1010 that protrude from the plate portion 1005. The optical guide 1000 may include anywhere from about 10-500 rods 1010 in some implementations. In one example implementation, the optical guide 1000 includes 150 rods.

The plate portion 1005 and the rods 1010 may be machined from a single monolithic disc of an optically transparent material such as quartz, sapphire or a carbon containing material such as an optically transparent carbon fiber. In one implementation, the disc is machined to remove the material between the rods to leave the rods 1010 and the plate portion 1005. For example, computer numerical control (CNC) machining such as grinding may be performed on a single disc or other object to remove material between the rods and generate the rods and the plate portion from the single disc or other object. The grinding may be followed by flame polishing, or start with plate and make holes by machining then insert rods with correct numerical aperture then to join at the interface. Alternatively, the rods 1010 and plate portion 1005 may be machined separately and may be bonded together. For example, holes may be drilled in the plate portion 1005, and the rods may be inserted into the plate portion and glued or otherwise bonded to the plate portion. In such an implementation, the plate portion may or may not be optically transparent. For example, if the holes are through holes, then the plate portion may not be optically transparent.

In some implementations, the rods 1010 may be an optically transparent material such as quartz, sapphire or a carbon containing material such as an optically transparent carbon fiber such as polystyrene or acrylic, and the plate portion 1005 may be composed of a material that is not optically transparent. The plate portion 1005 may be machined by drilling multiple through channels. The rods 1010 may then be inserted into the channels in the plate portion 1005 and bonded to the walls of the channels. Bottoms of the rods 1010 may be flush with a bottom surface of the plate portion 1005, may be recessed from the bottom surface of the plate portion 1005, or may protrude from the bottom surface of the plate portion 1005.

Figure 11:
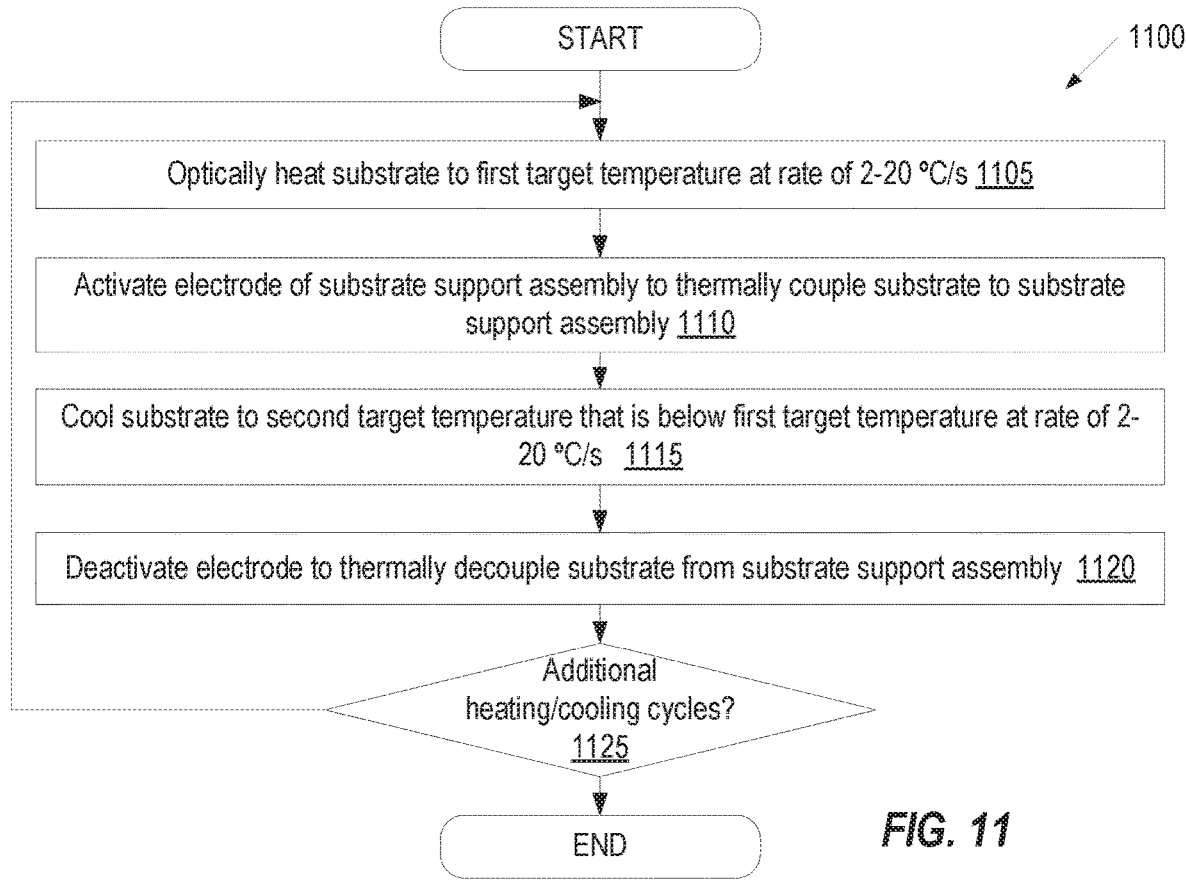
FIG. 11 illustrates a flowchart depicting a method of rapidly heating and cooling a substrate during a manufacturing process, in accordance with implementations of the present invention.

FIG. 11 illustrates a flowchart depicting a method 1100 of rapidly heating and cooling a substrate during a manufacturing process, in accordance with embodiments of the present invention. Method 1100 may be performed by a substrate support assembly in combination with one or more control systems that may control light emitted by light sources and/or electrodes of the substrate support assembly. The control systems may be coupled to additional systems that may include a recipe for performing a process. The recipe may specify target temperatures, process times, gas flow rates, and so on. Method 1100 may be performed as part of a deposition process, an etch process, an implant process, and so on. In embodiments method 1100 may be performed using any of the substrate support assemblies described herein.

At block 1105 of method 1100 a substrate supported by the substrate support assembly is optically heated to a first target temperature at a rate of about 2-20° C./s. In examples, the substrate is heated at a rate of 3° C./s, at a rate of 5° C./s, at a rate of 7° C./s, at a rate of 9° C./s, at a rate of 10° C./s, at a rate of 15° C./s, or at a rate of 20° C./s. Heating may also be expressed in terms of Watts. In some implementations, the heating is performed at about 5-20 W. The optical heating may be performed by directing light through a light carrying medium such as optical fibers and/or an optical guide and onto the substrate. The optical fibers and/or portions (e.g., rods) of the optical guide may extend into channels in the ceramic plate (e.g., of the electrostatic chuck) and shine directly on the substrate. The channels in the electrostatic chuck may be through channels. Vacuum may be maintained by glue or a bond between the light carrying medium and the ceramic plate (e.g., walls of the channel in the ceramic plate into which the light carrying medium is inserted).

The first target temperature may be between 120 and 400° C. Example target temperatures include 120° C., 130° C., 140° C., 150° C., 160° C., 170° C., 180° C., 200° C., 350° C., 400° C., etc. A chucking electrode of the substrate support assembly (e.g., of an electrostatic chuck in the substrate support assembly) may be deactivated during the heating to minimize a thermal contact between the substrate and the substrate support assembly. It may be beneficial to thermally decouple the substrate from the electrostatic chuck to minimize heat transfer from the substrate (which is heated) to the electrostatic chuck (which is not heated or minimally heated). In some embodiments, the optical heating is performed while lift pins are extended through the substrate support assembly. The lift pins may raise the support above the substrate support assembly to facilitate thermal decoupling of the substrate from the substrate support assembly during heating.

At block 1110, the electrode of the substrate support assembly (e.g., of the electrostatic chuck) is activated and lights that were providing light through the optical fibers are deactivated. Additionally, if the lift pins were extended to improve thermal decoupling between the electrostatic chuck and the substrate, then the lift pins may be retracted. Activation of the electrode "chucks" the electrode, pulling the electrode tightly against the substrate support assembly and sealing a region between the substrate and the substrate support assembly. Helium gas or other backside gas may also be flowed into the region between a top surface of the substrate support assembly (e.g., a top surface of the electrostatic chuck) and a bottom surface of the substrate. Activation of the electrode and/or pumping of helium gas into the region between the substrate and the substrate support assembly may thermally couple the substrate to the substrate support assembly.

The substrate support assembly may be maintained at or below a second target temperature that is lower than the first target temperature. The second target temperature may be, for example, anywhere from 20° C. (e.g., room temperature) to 100° C. By thermally coupling the substrate to the substrate support assembly, heat energy from the substrate may quickly dissipate into the substrate support assembly. Accordingly, at block 1115 the substrate is cooled to the second target temperature. The substrate support assembly may have a much larger thermal mass than the substrate, which may facilitate quick cooling of the substrate by the substrate support assembly. In one embodiment, the substrate cools at a rate of about 2-20° C.

Once the substrate has cooled to the second target temperature, at block 1120 the electrode is deactivated. The helium (or other backside gas) may be evacuated from the region between the substrate and the substrate support assembly. Alternatively, the helium gas may be allowed to naturally dissipate due to a loss of a seal between the substrate and the substrate support assembly. Deactivation of the electrode and/or evacuation of the helium gas may thermally decouple the substrate from the substrate support assembly.

In an alternative implementation, at block 1120 the electrode may not be deactivated and/or the helium may not be evacuated from the region between the substrate and the substrate support assembly. This may facilitate quicker processing times, but may cause heat from the substrate to drain into the substrate support assembly during heating. In such implementations, additional energy may be supplied to the substrate (in the form of light) to compensate for the heat loss to the substrate support assembly.

The rate at which heat energy is transferred from the substrate to the substrate support assembly may depend at least partially on a thermal conductivity of the ceramic plate (electrostatic chuck) of the substrate support assembly.

At block 1125, a determination is made as to whether any additional heating and/or cooling cycles are to be performed. If additional heating and/or cooling cycles are to be performed, the method returns to block 1105. Otherwise the method ends. In some embodiments, the substrate may be heated and/or cooled as many as 20 times or more in a single process.

Method 1100 is performed to alternately heat and cool a substrate during processing using substrate support assemblies described with reference to embodiments above. Traditional substrate support assemblies are capable of performing either heating of a substrate or cooling of a substrate, but not both heating and cooling of the substrate. The ability to both heat and cool a substrate as provided in embodiments herein enables numerous new processes to be implemented.

Electrostatic chucks and substrate support assemblies that can perform direct optical heating of substrates have been disclosed. The foregoing description discloses example implementations of the invention. Modifications of the above-disclosed apparatus, systems, and methods which fall within the scope of the invention will be readily apparent to those of ordinary skill in the art. Accordingly, the present invention has been disclosed in connection with example embodiments, and it should be understood that other embodiments may fall within the scope of the invention, as defined by the following claims.

What is claimed is:

1. A substrate support assembly, comprising:
   a ceramic plate, the ceramic plate comprising a top surface, a bottom surface and a first plurality of channels, wherein the top surface is to support a substrate;
   a cooling plate coupled to the bottom surface of the ceramic plate, the cooling plate comprising a second plurality of channels, wherein a first channel of the first plurality of channels aligns with a second channel of the second plurality of channels; and
   an optical guide, coupled to the cooling plate, to direct light onto the substrate, the optical guide comprising:
   a plate portion coupled to a bottom surface of the cooling plate; and
   a plurality of rods that protrude from the plate portion, wherein a first rod of the plurality of rods extends through the second channel in the cooling plate and into the first channel in the ceramic plate.

2. The substrate support assembly of claim 1, further comprising:
   a cooling base coupled to a bottom surface of the optical guide; and
   a plurality of light sources in the cooling base, wherein a first light source of the plurality of light sources is configured to emit light that is to be directed by the first rod onto the substrate.

3. The substrate support assembly of claim 2, wherein each light source of the plurality of light sources has a heating power of approximately 1-20 Watts.

4. The substrate support assembly of claim 2, wherein:
   the substrate is to be heated to a first target temperature and cooled to a second target temperature that is below the first target temperature;
   the cooling plate is to be maintained at or below the second target temperature and is to cool the substrate to the second target temperature; and
   the light is to heat the substrate to the first target temperature.

5. The substrate support assembly of claim 1, further comprising:
   a plurality of rings bonded to the bottom surface of the ceramic plate, the plurality of rings comprising at least one of Kovar or molybdenum;
   at least one of a metal tube or a metal bellows coupled to a first ring of the plurality of rings; and
   a metal backside cover coupled to a second ring of the plurality of rings.

6. The substrate support assembly of claim 1, wherein at least a portion of the optical guide is coated by a plasma resistant coating.

7. The substrate support assembly of claim 6, wherein the plasma resistant coating is a yttrium-containing ceramic.

8. The substrate support assembly of claim 7, wherein the yttrium-containing ceramic is selected from a group consisting of $Y_2O_3$, $Y_3Al_5O_{12}$, and a ceramic compound comprising $Y_4Al_2O_9$ and a solid-solution of $Y_2O_3$—$ZrO_2$.

9. The substrate support assembly of claim 1, wherein the optical guide comprises at least one of quartz, sapphire or a carbon containing material.

10. A substrate support assembly, comprising:
    a ceramic plate, the ceramic plate comprising a top surface, a bottom surface and a first channel, wherein the top surface is to support a substrate;
    a cooling plate coupled to the bottom surface of the ceramic plate, the cooling plate comprising a second channel;
    an optical guide, coupled to the cooling plate, to direct light onto the substrate, wherein at least a portion of the optical guide is disposed in the first channel in the ceramic plate and the second channel in the cooling plate;
    a cooling base coupled to the optical guide; and
    a light source, disposed in the cooling base, to emit the light.

11. The substrate support assembly of claim 10, further comprising:
    at least one of a lens or a reflector between the light source and the optical guide, wherein at least one of the lens or the reflector is to focus the light.

12. An optical heating system for a substrate support assembly comprising:
    a cooling base;
    a plurality of light sources disposed in the cooling base; and
    an optical guide comprising a material that is substantially transparent to light output by the plurality of light sources, the optical guide further comprising:
    a plate portion that is coupled to the cooling base; and
    a plurality of rods that protrude from the plate portion, wherein a rod of the plurality of rods aligns with a light source of the plurality of light sources so as to direct the light from the light source through the rod and onto a substrate supported by the substrate support assembly.

13. The optical heating system of claim 12, wherein the substrate support assembly comprises a ceramic plate having a first plurality of channels and a cooling plate coupled to a bottom of the ceramic plate, the cooling plate having a second plurality of channels, wherein the optical heating system is coupled to a bottom of the cooling plate, and wherein the plurality of rods are disposed in the first plurality of channels and the second plurality of channels.

14. The optical heating system of claim 12, further comprising:
    a plurality of lenses disposed in the cooling base, wherein a lens of the plurality of lenses is positioned proximate to a light source of the plurality of light sources to focus the light from the light source.

15. A substrate support assembly comprising:
    a ceramic plate comprising a top surface and a bottom surface, wherein the top surface is to support a substrate that is to be heated to a first target temperature and cooled to a second target temperature;
    a cooling plate coupled to the bottom surface of the ceramic plate, wherein the cooling plate is to be maintained at or below the second target temperature and is to cool the substrate to the second target temperature;
    a plurality of light transmission media coupled to at least one of the cooling plate or the ceramic plate; and
    a plurality of light sources disposed in at least one of the cooling plate or a separate cooling base, the plurality of light sources to emit light into the plurality of light transmission media to heat the substrate to the first target temperature.

16. The substrate support assembly of claim 15, further comprising an electrode in the ceramic plate, wherein a radio frequency signal is to be applied to at least one of the electrode or the cooling plate.

17. The substrate support assembly of claim 15, wherein the plurality of light sources comprises a plurality of halogen lamps.

18. The substrate support assembly of claim 15, wherein:
the plurality of light transmission media comprise a plurality of light diffusers.

* * * * *